US010393825B2

(12) United States Patent
Miyazawa

(10) Patent No.: US 10,393,825 B2
(45) Date of Patent: Aug. 27, 2019

(54) MANUFACTURING METHOD FOR GAS CELL, MANUFACTURING METHOD FOR MAGNETIC FIELD MEASUREMENT APPARATUS, AND GAS CELL

(71) Applicant: SEIKO EPSON CORPORATION, Tokyo (JP)

(72) Inventor: Tatsunori Miyazawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 142 days.

(21) Appl. No.: 15/616,058

(22) Filed: Jun. 7, 2017

(65) Prior Publication Data

US 2018/0003778 A1 Jan. 4, 2018

(30) Foreign Application Priority Data

Jul. 1, 2016 (JP) ................................ 2016-131380

(51) Int. Cl.

| | |
|---|---|
| ***G04F 5/14*** | (2006.01) |
| ***H03B 17/00*** | (2006.01) |
| ***C09D 191/08*** | (2006.01) |
| ***G01R 33/00*** | (2006.01) |
| ***C23C 14/28*** | (2006.01) |
| ***G01R 33/032*** | (2006.01) |
| ***C23C 14/04*** | (2006.01) |
| ***C23C 14/18*** | (2006.01) |

(52) U.S. Cl.

CPC ....... *G01R 33/0052* (2013.01); *C09D 191/08* (2013.01); *C23C 14/046* (2013.01); *C23C 14/18* (2013.01); *C23C 14/28* (2013.01); *G01R 33/032* (2013.01); *G04F 5/14* (2013.01); *H03B 17/00* (2013.01)

(58) Field of Classification Search

CPC .. C09D 191/06; C09D 191/08; C23C 14/046; C23C 14/18; C23C 14/28; G01R 33/0052; G01R 33/032; G01R 33/26; G04F 5/14; G04F 5/145; H03B 17/00; H03L 7/26

USPC ..................................................... 331/3, 94.1

See application file for complete search history.

(56) References Cited

U.S. PATENT DOCUMENTS

| | | | | |
|---|---|---|---|---|
| 9,151,808 B2 | 10/2015 | Nagasaka et al. | | |
| 2012/0206135 A1* | 8/2012 | Nagasaka | G01R 33/26 | 324/244.1 |
| 2013/0047417 A1* | 2/2013 | Nagasaka | G01R 33/0076 | 29/592.1 |
| 2013/0230673 A1* | 9/2013 | Nagasaka | A61B 5/04005 | 428/34.1 |

(Continued)

FOREIGN PATENT DOCUMENTS

| | | |
|---|---|---|
| JP | 2012-183290 A | 9/2012 |
| JP | 2013-007720 A | 1/2013 |

(Continued)

*Primary Examiner* — Levi Gannon

(74) *Attorney, Agent, or Firm* — Oliff PLC

(57) ABSTRACT

A manufacturing method for a gas cell includes disposing a holding member including a coating material in a reservoir of a cell having a main chamber, the reservoir communicating with the main chamber, and an opening provided in the reservoir, sealing the cell, heating the holding member so as to generate a vapor of the coating material in the cell, and cooling the cell so as to form a film of the coating material on an inner wall of the cell.

18 Claims, 13 Drawing Sheets

(56) References Cited

U.S. PATENT DOCUMENTS

| | | | | |
|---|---|---|---|---|
| 2013/0341745 | A1* | 12/2013 | Suzuki | G01R 33/032 257/427 |
| 2014/0306700 | A1* | 10/2014 | Kamada | G01R 33/26 324/244.1 |
| 2015/0369427 | A1* | 12/2015 | Nagasaka | F17C 13/00 206/0.6 |
| 2016/0025822 | A1* | 1/2016 | Takahashi | G01R 33/032 324/244.1 |
| 2016/0169989 | A1* | 6/2016 | Suzuki | G01R 33/26 324/305 |
| 2016/0313418 | A1* | 10/2016 | Fujii | G01R 33/26 |

FOREIGN PATENT DOCUMENTS

| | | | | |
|---|---|---|---|---|
| JP | 2015-053452 A | | 3/2015 | |
| WO | WO 2016/016977 | * | 2/2016 | G01R 33/26 |

* cited by examiner

MANUFACTURING METHOD FOR GAS CELL, MANUFACTURING METHOD FOR MAGNETIC FIELD MEASUREMENT APPARATUS, AND GAS CELL

BACKGROUND

1. Technical Field

The present invention relates to a manufacturing method for a gas cell, a manufacturing method for a magnetic field measurement apparatus, and a gas cell.

2. Related Art

There is an optical pumping magnetic field measurement apparatus which irradiates a gas cell in which an alkali metal gas is enclosed with linearly polarized light, and measures a magnetic field according to a rotation angle of a polarization plane (for example, refer to JP-A-2013-7720). JP-A-2013-7720 discloses a configuration of a gas cell and a manufacturing method therefor in which an alkali metal substance is accommodated in a cavity of a cell whose inner wall is coated with paraffin, the cavity is sealed, and an alkali metal gas is generated through a thermal reaction or the like so as to fill the cell inside. According to the disclosure of JP-A-2013-7720, a coating material is disposed in a cavity formed in a substrate, and the cavity is sealed by disposing another substrate on the substrate. The coating material is vaporized by heating the entire cell, and is then cooled so that a coating material layer is formed on the inner wall of the cavity.

The coating material layer has a function of preventing or reducing a change in a behavior (for example, spin) when alkali metal atoms directly collide with the inner wall of the cell. Paraffin which is appropriately used as a coating material is generally a soft solid (waxy) at the room temperature, and is thus hard to handle when an amount thereof is finely adjusted or the paraffin is disposed inside the cell. Thus, there is concern that an amount of disposed paraffin may vary in a disposing step, or the number of steps may increase, but JP-A-2013-7720 does not disclose a method of handling or disposing a coating material.

If an amount of the coating material disposed inside the cell varies, a coating material film formed on the inner wall of the cell may not have a desired film thickness, and thicknesses of coating material films may be different from each other between individuals. Thus, there is a problem in that quality (sensitivity, measurement accuracy, or the like) of a manufactured gas cell deteriorates, or differences between qualities of individuals occur.

SUMMARY

An advantage of some aspects of the invention is to solve at least a part of the problems described above, and the invention can be implemented as the following forms or application examples.

APPLICATION EXAMPLE 1

A manufacturing method for a gas cell according to this application example includes disposing a holding member including a coating material in a second chamber of a cell having a first chamber, the second chamber communicating with the first chamber, and an opening provided in the second chamber; sealing the opening with a sealing member so as to seal the cell; heating the holding member so as to generate a vapor of the coating material in the cell; and cooling the cell so as to form a film of the coating material on an inner wall of the cell.

According to the manufacturing method of this application example, in the disposing of the holding member, since the coating material is handled in a state of being included in the holding member, an amount of the coating material can be easily adjusted to a desired amount on the basis of a length of the holding member, and the coating material can also be easily disposed in the second chamber, compared with a case where only the coating material is handled. It is possible to reduce a variation in an amount of the coating material disposed in each cell by managing the length of the holding member (reducing a variation in the length thereof). Thus, in the forming of the film, it is possible to stably form a film of the coating material with a desired film thickness on the inner wall of the cell, and also to minimize a variation in a thickness of a formed film of the coating material between individuals. Consequently, it is possible to stably and efficiently manufacture the gas cell by reducing deterioration in quality (sensitivity, measurement accuracy, or the like) or reducing differences between qualities of individuals.

APPLICATION EXAMPLE 2

In the manufacturing method for a gas cell according to the application example, it is preferable that the holding member is made of a heat-resistive material.

According to the manufacturing method of this application example, since the holding member is made of the heat-resistive material, it is possible to prevent degradation of the holding member due to heat or generation of a gas from the holding member when the holding member is heated in the heating of the holding member. Consequently, it is possible to prevent deterioration in quality (sensitivity, measurement accuracy, or the like) of the gas cell caused by degradation of the holding member or mixing of a gas from the holding member.

APPLICATION EXAMPLE 3

In the manufacturing method for a gas cell according to the application example, it is preferable that the holding member is made of a nonmagnetic material.

According to the manufacturing method of this application example, the holding member is made of a nonmagnetic material which is hardly magnetized even if the material is placed in a magnetic field. Thus, for example, in a case where the gas cell is used for magnetic field measurement, it is possible to prevent magnetization of the holding member from influencing the magnetic field measurement.

APPLICATION EXAMPLE 4

In the manufacturing method for a gas cell according to the application example, it is preferable that the holding member is a tubular member.

According to the manufacturing method of this application example, the holding member is a tubular member having the cavity whose both ends are open. Thus, since the cavity of the holding member can be filled with the coating material and hold the coating material, the coating material can be easily handled. It is possible to easily adjust an amount of the coating material filling the holding member by setting the length of the tubular holding member as appropriate. When the vapor of the coating material is generated in the heating of the holding member, the coating material filling the cavity of the holding member can be easily vaporized from both of the open ends by heating the holding member.

APPLICATION EXAMPLE 5

In the manufacturing method for a gas cell according to the application example, it is preferable that the holding member is made of a light transmissive material.

According to the manufacturing method of this application example, the holding member is made of a light transmissive material. Thus, it is possible to easily check whether or not the coating material can fill the holding member with the naked eyes when filling the cavity of the holding member. It is possible to easily check whether or not the whole of the coating material filling the cavity is vaporized with the naked eyes when the vapor of the coating material is generated in the heating of the holding member. In the heating of the holding member, the coating material can be irradiated with laser light through the holding member. Thus, the coating material can be directly heated.

APPLICATION EXAMPLE 6

In the manufacturing method for a gas cell according to the application example, it is preferable that, in the disposing of the holding member, a solid containing an alkali metal is disposed in the second chamber along with the holding member, and the method further includes irradiating the solid with laser light so as to generate a gas of the alkali metal after the film of the coating material is formed.

According to the manufacturing method of this application example, the solid containing the alkali metal is disposed in the second chamber and is sealed along with the holding member including the coating material, a film of the coating material is formed on the inner wall of the cell, and then an alkali metal gas is generated from the solid after the film of the coating material is formed. Thus, the formed film of coating material can prevent or reduce a change in a behavior when excited alkali metal atoms directly collide with the inner wall of the cell. It is possible to reduce the number of sealing steps to one, and thus to prevent impurities from entering the second chamber from the outside after the film of the coating material is formed, compared with a case where the cell is temporarily sealed, the temporary sealing is removed after a film of the coating material is formed on the inner wall, and the solid containing the alkali metal is disposed in the second chamber and is then sealed.

APPLICATION EXAMPLE 7

A manufacturing method for a magnetic field measurement apparatus according to this application example includes manufacturing a gas cell by the manufacturing method for a gas cell described above.

According to the manufacturing method of this application example, it is possible to manufacture the magnetic field measurement apparatus including the gas cell with high quality and less variation, and thus to stably manufacture the high performance magnetic field measurement apparatus.

APPLICATION EXAMPLE 8

A gas cell according to this application example includes a cell that has a first chamber, a second chamber communicating with the first chamber, and an opening provided in the second chamber; a sealing member that seals the opening so as to seal the cell; and a holding member that includes a coating material disposed in the second chamber.

According to the configuration of this application example, if the holding member including the coating material disposed in the second chamber is heated, the coating material is vaporized in the cell, and then if the cell is cooled, a film of the coating material is formed on the inner wall of the cell. Therefore, it is possible to obtain the gas cell in which a layer of the coating material is formed on the inner wall of the cell. Here, since the coating material in a state of being included in the holding member can be handled when the coating material is disposed in the second chamber, an amount of the coating material can be easily adjusted on the basis of a length of the holding member, and the coating material can also be disposed in the second chamber, compared with a case where only the coating material is handled. Thus, by reducing differences between individuals, it is possible to more uniformly form a film of the coating material in the cell and also to reduce the number of steps due to handling of the coating material. Consequently, it is possible to efficiently obtain the gas cell with less variation in performance.

APPLICATION EXAMPLE 9

In the gas cell according to the application example, it is preferable that the holding member is made of a heat-resistive material.

According to the configuration of this application example, since the holding member is made of the heat-resistive material, the coating material can be vaporized by heating the holding member without degradation of the holding member or generation of a gas from the holding member.

APPLICATION EXAMPLE 10

In the gas cell according to the application example, it is preferable that the holding member is made of a nonmagnetic material.

According to the configuration of this application example, since the holding member is made of a nonmagnetic material which is hardly magnetized even if the material is placed in a magnetic field, for example, in a case where the gas cell is used for magnetic field measurement, it is possible to prevent magnetization of the holding member from influencing the magnetic field measurement.

APPLICATION EXAMPLE 11

In the gas cell according to the application example, it is preferable that the holding member is a tubular member.

According to the configuration of this application example, since the holding member is a tubular member having the cavity whose both ends are open, the cavity of the holding member can be filled with the coating material and hold the coating material, and thus the coating material can be easily handled. It is possible to easily adjust an amount of the coating material by setting the length of the tubular holding member as appropriate. The coating material filling the cavity of the holding member can be easily vaporized from both of the open ends by heating the holding member.

APPLICATION EXAMPLE 12

In the gas cell according to the application example, it is preferable that the holding member is made of a light transmissive material.

According to the configuration of this application example, since the holding member is made of a light transmissive material, it is possible to easily check whether or not the coating material can fill the cavity of the holding member with the naked eyes when filling the cavity of the holding member. It is possible to easily check whether or not the whole of the coating material filling the cavity is vaporized with the naked eyes when the vapor of the coating material is generated. The coating material can be irradiated with laser light through the holding member. Thus, the coating material can be directly heated.

APPLICATION EXAMPLE 13

It is preferable that the gas cell according to the application example further includes a solid that contains an alkali metal disposed in the second chamber.

According to the configuration of this application example, if the solid containing the alkali metal disposed in the second chamber is vaporized after a film of the coating material is formed on the inner wall of the cell, it is possible to obtain the gas cell in which an alkali metal gas fills the cell of which a layer of the coating material is formed on the inner wall. Since the solid containing the alkali metal is disposed in the second chamber along with the holding member including the coating material in advance, it is possible to prevent impurities from entering the second chamber from the outside, compared with a case where the solid containing the alkali metal is disposed in the second chamber after a film of the coating material is formed on the inner wall of the cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings. The drawings to be used are enlarged, reduced, or exaggerated as appropriate so that a described portion can be recognized. Elements other than constituent elements necessary in description may not be illustrated.

Configuration of Magnetic Field Measurement Apparatus

Figure 1:
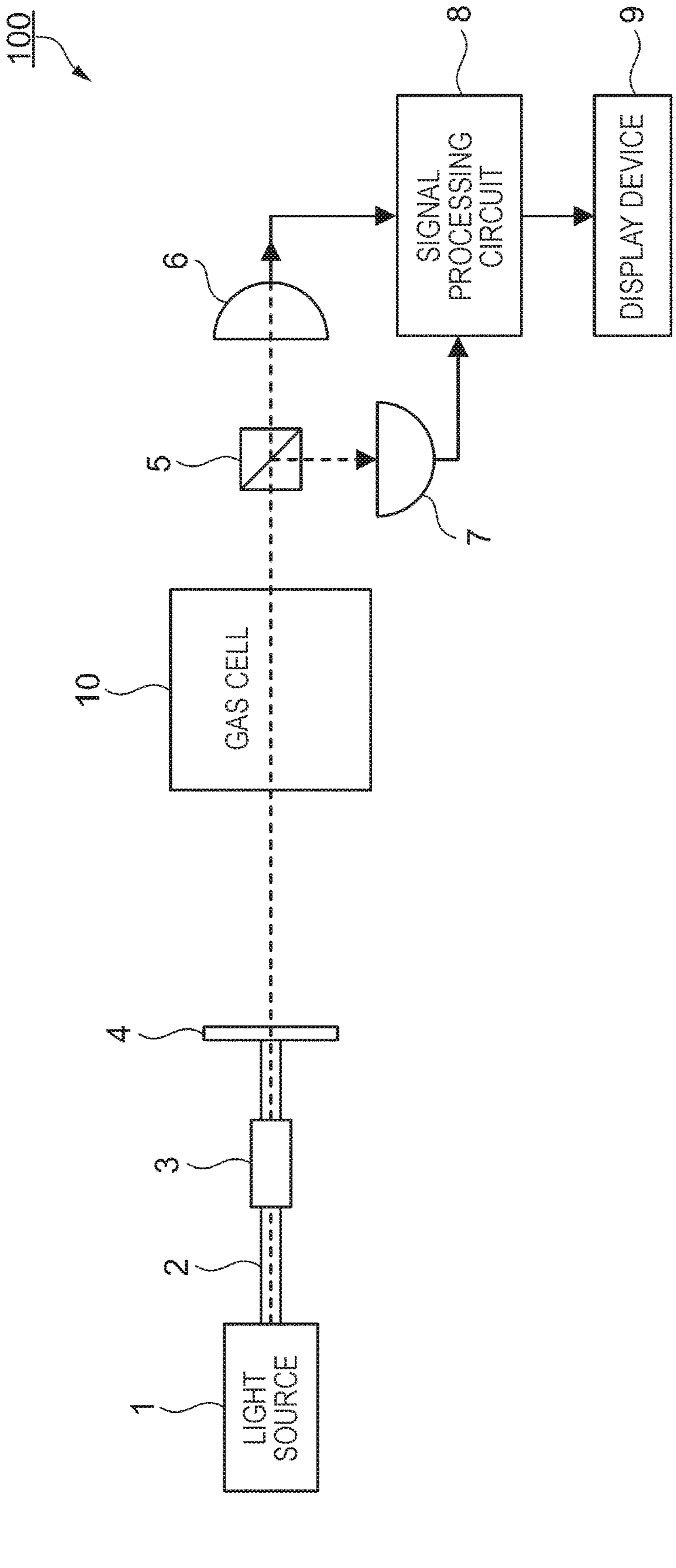
FIG. 1 is a block diagram illustrating a configuration of a magnetic field measurement apparatus according to the present embodiment.

With reference to FIG. 1, a description will be made of a configuration of a magnetic field measurement apparatus according to the present embodiment. FIG. 1 is a block diagram illustrating a configuration of a magnetic field measurement apparatus according to the present embodiment. A magnetic field measurement apparatus 100 according to the present embodiment is a magnetic field measurement apparatus using nonlinear magneto-optical rotation (NMOR). The magnetic field measurement apparatus 100 is used for a biological state measurement apparatus (a magnetoencephalograph or a magnetocardiograph) measuring a weak magnetic field generated from a living body, such as a magnetic field (heart magnetic field) from the heart or a magnetic field (brain magnetic field) from the brain. The magnetic field measurement apparatus 100 may be used for a metal detector or the like.

As illustrated in FIG. 1, the magnetic field measurement apparatus 100 includes a light source 1, an optical fiber 2, a connector 3, a polarization plate 4, a gas cell 10, a polarized light splitter 5, a photodetector (PD) 6, a photodetector 7, a signal processing circuit 8, and a display device 9. An alkali metal gas (gaseous alkali metal atoms) is enclosed in the gas cell 10.

As an alkali metal, for example, cesium (Cs), rubidium (Rb), potassium (K), and sodium (Na) may be used. For example, cesium has a melting point of about 28° C., and, thus, if cesium is used, the magnetic field measurement apparatus 100 can be operated at a temperature closer to the room temperature. Hereinafter, a case where cesium is used as an alkali metal will be described as an example.

The light source 1 is a device, for example, a tunable laser device which outputs a laser beam with a wavelength (for example, 894 nm corresponding to a Dl ray) corresponding to an absorption ray of cesium. The laser beam output from the light source 1 is so-called continuous wave (CW) light having a continuously constant light amount.

The polarization plate 4 is an element which polarizes the laser beam in a specific direction so as to generate linearly polarized light. The optical fiber 2 is a member which guides the laser beam output from the light source 1 toward the gas cell 10 side. As the optical fiber 2, for example, a single-mode optical fiber through which only a fundamental mode propagates is used. The connector 3 is a member connecting the optical fiber 2 to the polarization plate 4. The connector 3 is a screwed member, and connects the optical fiber 2 to the polarization plate 4.

Figure 2:
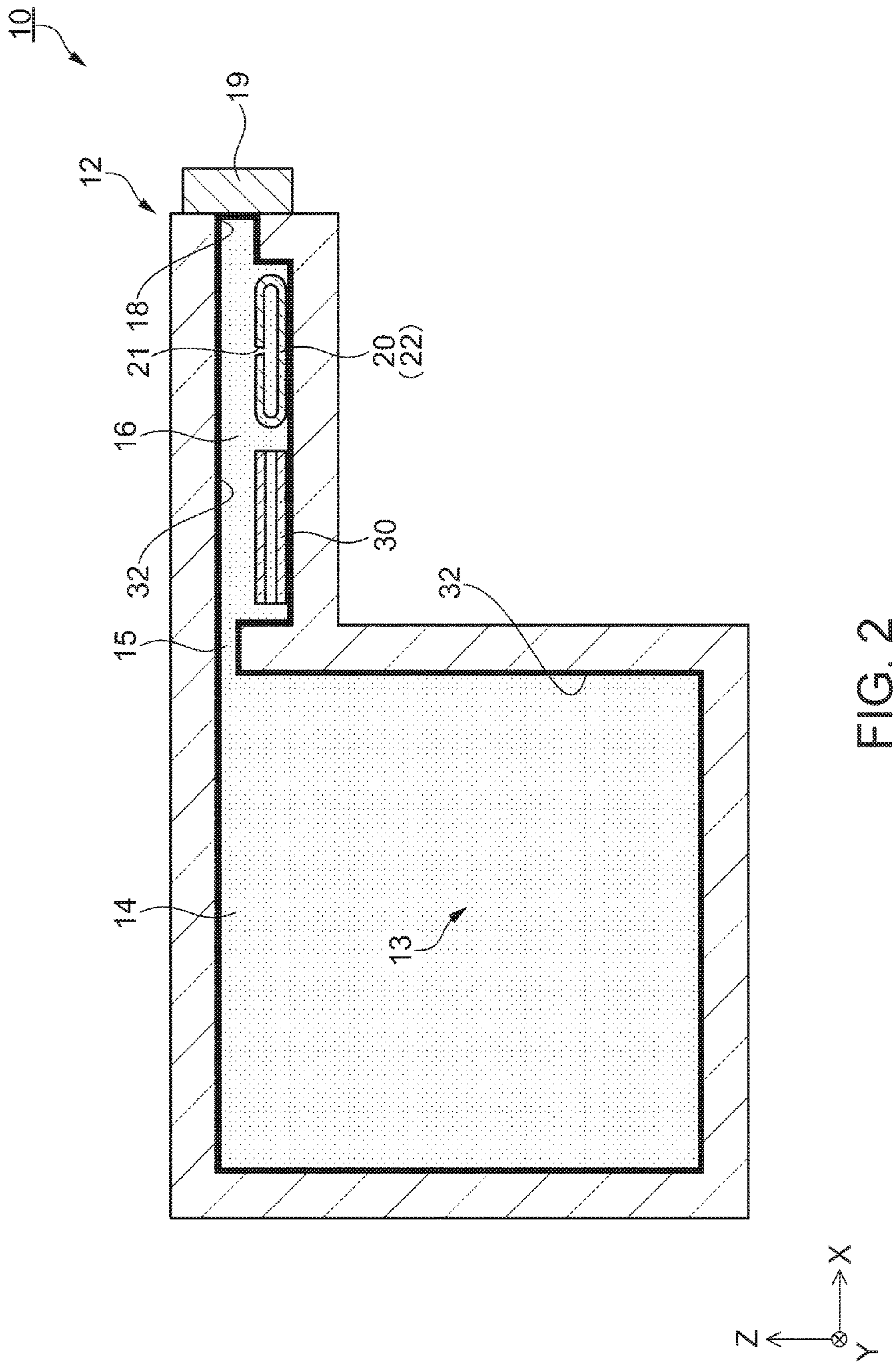
FIG. 2 is a sectional view along a longitudinal direction of a gas cell according to the present embodiment.

The gas cell 10 is a box (cell) having a cavity therein, and a vapor of the alkali metal (an alkali metal gas 13 illustrated in FIG. 2) is enclosed in the cavity (a main chamber 14 illustrated in FIG. 2). A configuration of the gas cell 10 will be described later.

The polarized light splitter 5 is an element which splits the incident laser beam into two beams having polarization components which are orthogonal to each other. The polarized light splitter 5 is, for example, a Wollastone prism or a polarized beam splitter. The photodetector 6 and the photodetector 7 are detectors having sensitivity for a wavelength of the laser beam, and outputs a current corresponding to an amount of incident light to the signal processing circuit 8. The photodetector 6 and the photodetector 7 are preferably made of a nonmagnetic material since magnetic fields generated therefrom may influence measurement. The photodetector 6 and the photodetector 7 are disposed on the same side (downstream side) as the polarized light splitter 5 when viewed from the gas cell 10.

Describing arrangement of the respective constituent elements of the magnetic field measurement apparatus 100 along the path of the laser beam, the light source 1 is located on the most upstream side of the path of the laser beam, and, the optical fiber 2, the connector 3, the polarization plate 4, the gas cell 10, the polarized light splitter 5, and the photodetectors 6 and 7 are disposed in this order from the upstream side.

The laser beam output from the light source 1 is guided to the optical fiber 2, and reaches the polarization plate 4. The laser beam having passed through the polarization plate 4 is converted into linearly polarized light having a higher polarization degree. The laser beam which is being transmitted through the gas cell 10 excites (optical pumping) alkali metal atoms enclosed in the gas cell 10. At this time, the laser beam is subjected to a polarization plane rotation action corresponding to the intensity of a magnetic field, and thus a polarization plane is rotated. The laser beam having been transmitted through the gas cell 10 is split into two beams having polarization components by the polarized light splitter 5. Amounts of the two beams having polarization components are measured (probed) by the photodetector 6 and the photodetector 7.

The signal processing circuit 8 receives signals respectively indicating the amounts of the beams measured by the photodetector 6 and the photodetector 7. The signal processing circuit 8 measures a rotation angle of the polarization plane of the laser beam on the basis of the received respective signals. The rotation angle of the polarization plane is expressed by a function based on the intensity of a magnetic field in a propagation direction of the laser beam (for example, refer to D. Budker, five others, "Resonant nonlinear magneto-optical rotation effects in atoms", Review of Modern Physics, U.S.A, American Physical Society, October 2002, Vol. 74, No. 4, Equation (2) of p. 1153 to 1201; Equation (2) relates to linear optical rotation, but almost the same equation can be used for NMOR). The signal processing circuit 8 measures the intensity of a magnetic field in the propagation direction of the laser beam on the basis of the rotation angle of the polarization plane. The display device 9 displays the intensity of a magnetic field measured by the signal processing circuit 8.

Next, a description will be made of configurations of the gas cell according to the present embodiment and an ampoule used for the gas cell with reference to FIGS. 2, 3A and 3B.

Configuration of Gas Cell

FIG. 2 is a sectional view taken along a longitudinal direction of the gas cell according to the present embodiment. In FIG. 2, a height direction of the gas cell 10 is set to as a Z axis, and an upper side is set to a +Z direction. A longitudinal direction of the gas cell 10 which intersects the Z axis is set to an X axis, and the right side in FIG. 2 is set to a +X direction. A width direction of the gas cell 10 intersecting the Z axis and the X axis is set to a Y axis, and a direction from the front of the paper surface of FIG. 2 toward a depth is set to a +Y direction.

As illustrated in FIG. 2, the gas cell 10 according to the present embodiment includes a cell 12 and a sealing member 19. The cell 12 is a box (cell) having a cavity therein, and is formed by using a tabular member made of, for example, quartz glass. A thickness of the cell 12 (tabular member) is 1 mm to 5 mm, and is, for example, about 1.5 mm.

The cell 12 has, as the internal cavity, the main chamber 14 as a first chamber, and a reservoir 16 as a second chamber having the X axis direction as a longitudinal direction. The main chamber 14 and the reservoir 16 are disposed side by side in the X axis direction, and communicate with each other via a communication hole 15. The communication hole 15 is provided on an upper side (+Z direction side) of the main chamber 14 and the reservoir 16. The communication hole 15 has, for example, a rectangular shape, but may have a circular shape. A sectional area of the communication hole 15 is, for example, 0.01 $mm^2$ to 3 $mm^2$.

The cell 12 (the main chamber 14 and the reservoir 16) is filled with the gas (hereinafter, referred to as an alkali metal gas) 13 as a result of the alkali metal being vaporized. An inert gas such as a rare gas may be present in the main chamber 14 and the reservoir 16 in addition to the alkali metal gas 13.

A film-like coating material 32 is disposed on an inner wall of the cell 12 (the main chamber 14 and the reservoir 16). The coating material 32 has a function of preventing or reducing a change in a behavior (for example, spin) when excited alkali metal atoms directly collide with the inner wall of the cell 12 (main chamber 14). Details of the coating material 32 will be described later.

An ampoule 20 and a holding member 30 are stored in the reservoir 16. A penetration hole (opening) 21 is formed in a glass tube 22 of the ampoule 20. The alkali metal gas 13 is obtained as a result of an alkali metal solid 24 (refer to FIG. 3A) filling the ampoule 20 being vaporized (being made gaseous) in manufacturing steps which will be described later. The holding member 30 is a tubular member having a cavity whose both ends are open. The film-like coating material 32 is formed as a film as a result of the coating material filling the holding member 30 being temporarily vaporized and then cooled in a manufacturing step which will be described later.

FIG. 2 illustrates that the ampoule 20 and the holding member 30 are arranged in a line so that each longitudinal direction thereof is along the X axis, but arrangement of the ampoule 20 and the holding member 30 is not limited to this form. For example, each longitudinal direction of the ampoule 20 and the holding member 30 may not be along the X axis, and the ampoule 20 and the holding member 30 may be disposed to be arranged laterally in two lines. Details of the ampoule 20 and the holding member 30 will be described later.

An opening 18 is provided on an opposite side (+X direction side) to the main chamber 14 and the communication hole 15 in the longitudinal direction of the reservoir 16. The opening 18 has, for example, a circular shape. An inner diameter of the opening 18 is, for example, about 0.4 mm to 1.5 mm. The opening 18 is sealed with the sealing member 19 bonded to the cell 12. Consequently, the cell 12 (the main chamber 14 and the reservoir 16) is sealed.

The sealing member 19 has, for example, a planar rectangular shape, but may have other shapes such as a circular shape. As a material of the sealing member 19, the glass base material as that of the cell 12 is used, and, for example, quartz glass is used. The sealing member 19 is bonded to the cell 12 via a low melting point glass frit or the like disposed around the opening 18.

Configuration of Ampoule

Figure 3A:
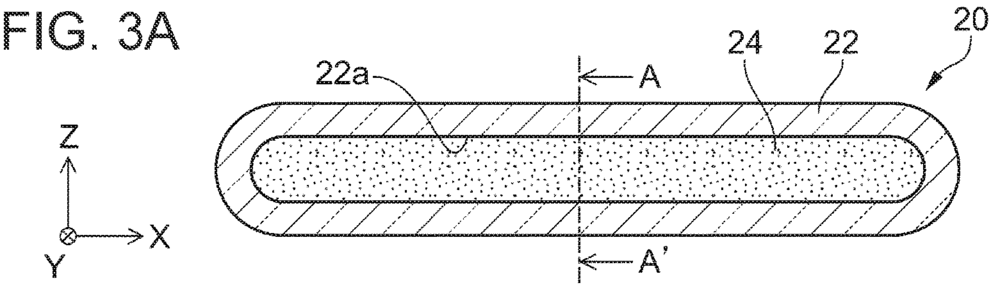
FIG. 3A is a sectional view along a longitudinal direction of an ampoule according to the present embodiment.

FIG. 3A is a sectional view along a longitudinal direction of the ampoule according to the present embodiment. FIG. 3B is a sectional view taken along the line A-A' in FIG. 3A. As illustrated in FIG. 3A, the ampoule 20 which is a solid containing the alkali metal according to the present embodiment has a longitudinal direction. FIG. 3A illustrates an X-Z section when the ampoule 20 is disposed so that the longitudinal direction thereof is along the X axis direction. The ampoule 20 is formed of the hollow glass tube 22.

The glass tube 22 is made of, for example, borosilicate glass. The material of the glass tube 22 is a nonmagnetic material which is hardly magnetized even if the material is placed in a magnetic field, and thus it is possible to prevent the glass tube 22 from influencing magnetic field measurement in a case where the gas cell 10 is used for the magnetic field measurement apparatus 100. The glass tube 22 extends in the longitudinal direction, and both ends thereof are welded. Consequently, the glass tube 22 having the cavity therein is sealed. A shape of each of both ends of the glass tube 22 is not limited to a round shape as illustrated in FIG. 3A, and may be a shape close to a plane, a partially sharp shape, or the like.

FIG. 3A illustrates a state in which the ampoule 20 (glass tube 22) is sealed. A cavity 22*a* inside the glass tube 22 is filled with the alkali metal solid (granular or powdery alkali metal atoms) 24. The ampoule 20 is formed by filling the cavity 22*a* of the tubular glass tube 22 with the alkali metal solid 24 and welding and sealing both ends of the glass tube 22 under a low pressure environment (ideally, under vacuum) close to vacuum. As the alkali metal solid 24, as described above, rubidium, potassium, sodium, and the like may be used in addition to cesium as described above.

The glass tube 22 is in an sealing state in a stage in which the ampoule 20 is manufactured, but the penetration hole 21 (refer to FIG. 2) is formed in the glass tube 22, and thus sealing is broken in a stage in which the gas cell 10 is completed. Consequently, the alkali metal solid 24 in the ampoule 20 is vaporized and flows into the gas cell 10, and thus the cavity of the cell 12 is filled with the alkali metal gas 13 (refer to FIG. 2). A gap with about 1.5 mm is provided in, for example, +Z direction between an upper surface of the ampoule 20 and an inner surface of the cell 12 so that the alkali metal solid 24 is easily vaporized to flow out of the ampoule 20 (refer to FIG. 2).

Figure 3B:
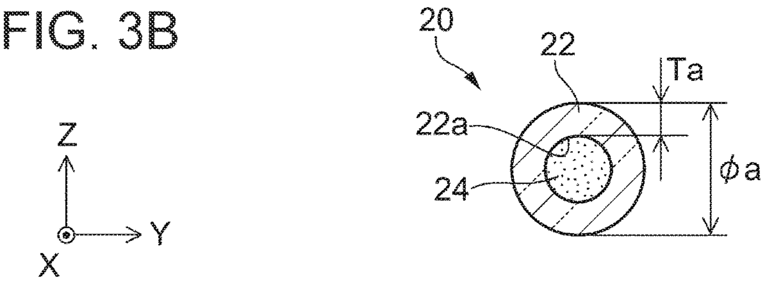
FIG. 3B is a sectional view taken along the line A-A' in FIG. 3A.

FIG. 3B illustrates a Y-Z section of the ampoule 20 in a direction intersecting the longitudinal direction thereof. As illustrated in FIG. 3B, a shape of the Y-Z section of the glass tube 22 is, for example, a substantially circular shape, but may be other shapes. An outer diameter $\phi a$ of the glass tube 22 is 0.3 mm≤$\phi a$≤1.2 mm. A thickness Ta of the glass tube 22 is 0.1 mm≤Ta≤0.5 mm, and is preferably about 20% of the outer diameter $\phi a$. If the thickness Ta of the glass tube 22 is less than 0.1 mm, the glass tube 22 is easily broken, and if the thickness Ta of the glass tube 22 is more than 0.5 mm, it is hard to perform processing (which will be described later in detail) for forming the penetration hole 21 in the glass tube 22.

Configuration of Holding Member

Figure 4A:
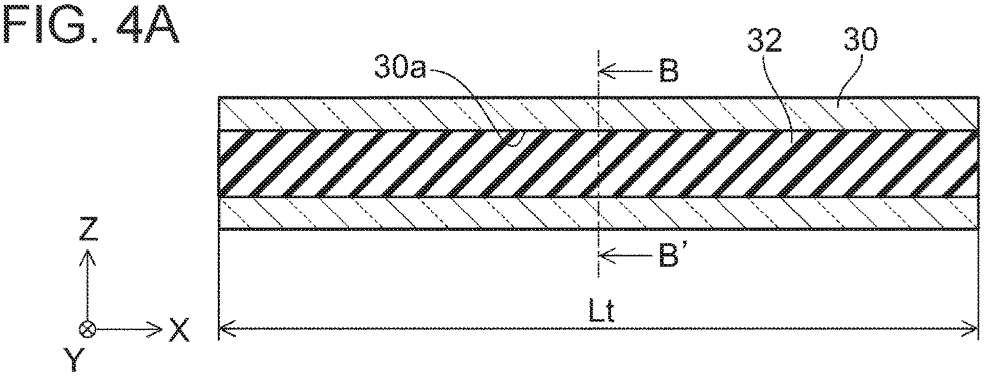
FIG. 4A is a sectional view along a longitudinal direction of a holding member according to the present embodiment.
Figure 4B:
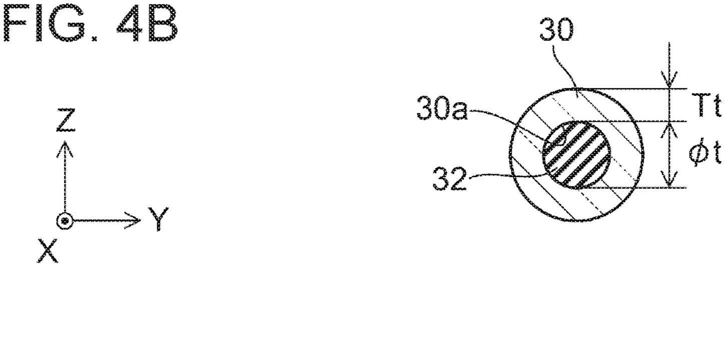
FIG. 4B is a sectional view taken along the line B-B' in FIG. 4A.

FIG. 4A is a sectional view along a longitudinal direction of the holding member according to the present embodiment. FIG. 4B is a sectional view taken along the line B-B' in FIG. 4A. As illustrated in FIG. 4A, the holding member 30 including the coating material 32 according to the present embodiment has a longitudinal direction. FIG. 4A illustrates an X-Z section when the holding member 30 is disposed so that the longitudinal direction thereof is along the X axis direction.

FIG. 4A illustrates a state in which a cavity 30*a* of the holding member 30 is filled with the coating material 32. The holding member 30 is a tubular narrow tube. The holding member 30 extends in the longitudinal direction (X axis direction), and both ends thereof are open. The holding member 30 is made of a nonmagnetic material which has heat resistance and light transmissive property. The holding member 30 is made of, for example, an inorganic material such as glass or quartz. The holding member 30 is made of a nonmagnetic material which is hardly magnetized even if the material is placed in a magnetic field, and thus it is possible to prevent the holding member 30 from influencing magnetic field measurement in a case where the gas cell 10 is used for the magnetic field measurement apparatus 100.

The cavity 30*a* of the holding member 30 is filled with the coating material 32. The coating material 32 is composed of saturated chain hydrocarbon such as paraffin. The coating material 32 preferably has the carbon atom number n of 20 to 100 in the chemical formula ($C_nH_{2n+2}$) of the saturated chain hydrocarbon. As an example of the saturated chain hydrocarbon, pentacontane represented by the chemical formula ($C_{50}H_{102}$) may be appropriately used.

The coating material 32 fills the cavity 30*a* of the holding member 30 in a state in which the coating material 32 is heated to a temperature which is equal to or higher than a melting point so as to be melted under a low pressure environment close to vacuum. For example, in a case where pentacontane is used for the coating material 32, the coating material 32 is heated to a temperature of about 150° C. to 200° C. under a low pressure environment reduced to about $2\times10^{-6}$ Torr, and can thus fill the cavity 30*a* of the holding member 30. As will be described later, the coating material 32 filling the cavity 30*a* of the holding member 30 is heated in the reservoir 16 so as to be vaporized, and is then cooled so as to form a film on the inner wall of the cell 12 (the main chamber 14 and the reservoir 16) (refer to FIG. 2).

Since the holding member 30 is made of the material having heat resistance, the coating material can be vaporized without degradation of the holding member or generation of a gas from the holding member when the holding member is filled with the melted coating material 32, and when the coating material 32 is vaporized. Since the holding member 30 is made of the light transmissive material, it is possible to easily check whether or not the coating material 32 can fill the holding member when filling the holding member with the coating material 32 in a state of being melted, and whether or not the whole of the coating material 32 is vaporized when the coating material 32 is vaporized, with the naked eyes.

FIG. 4B illustrates a Y-Z section in a direction intersecting the longitudinal direction of the holding member 30. As illustrated in FIG. 4B, a shape of the Y-Z section of the holding member 30 is, for example, a substantially circular shape, but may be other shapes. An inner diameter ϕt of the cavity 30*a* of the holding member 30 is 0.1 mm≤ϕt≤0.2 mm. If the capillary phenomenon is used when the holding member 30 is filled with the coating material 32, the coating material 32 can be efficiently introduced into the cavity 30*a* of the holding member 30, and thus the inner diameter ϕt is preferably 0.1 mm≤ϕt≤0.15 mm. A thickness Tt of the holding member 30 is, for example, about 0.1 mm to 0.5 mm, but is not particularly limited.

A length Lt in the longitudinal direction of the holding member 30 illustrated in FIG. 4A is, for example, about 0.5 mm to 15 mm, but is not limited thereto, and is set as appropriate depending on an amount (volume) of the coating material 32 which is required to forma film covering the inner wall of the cell 12 (the main chamber 14 and the reservoir 16). In other words, it is possible to easily adjust an amount of the coating material 32 disposed in the cell 12 by setting the length Lt of the holding member 30.

Manufacturing Method for Gas Cell

Figure 5:
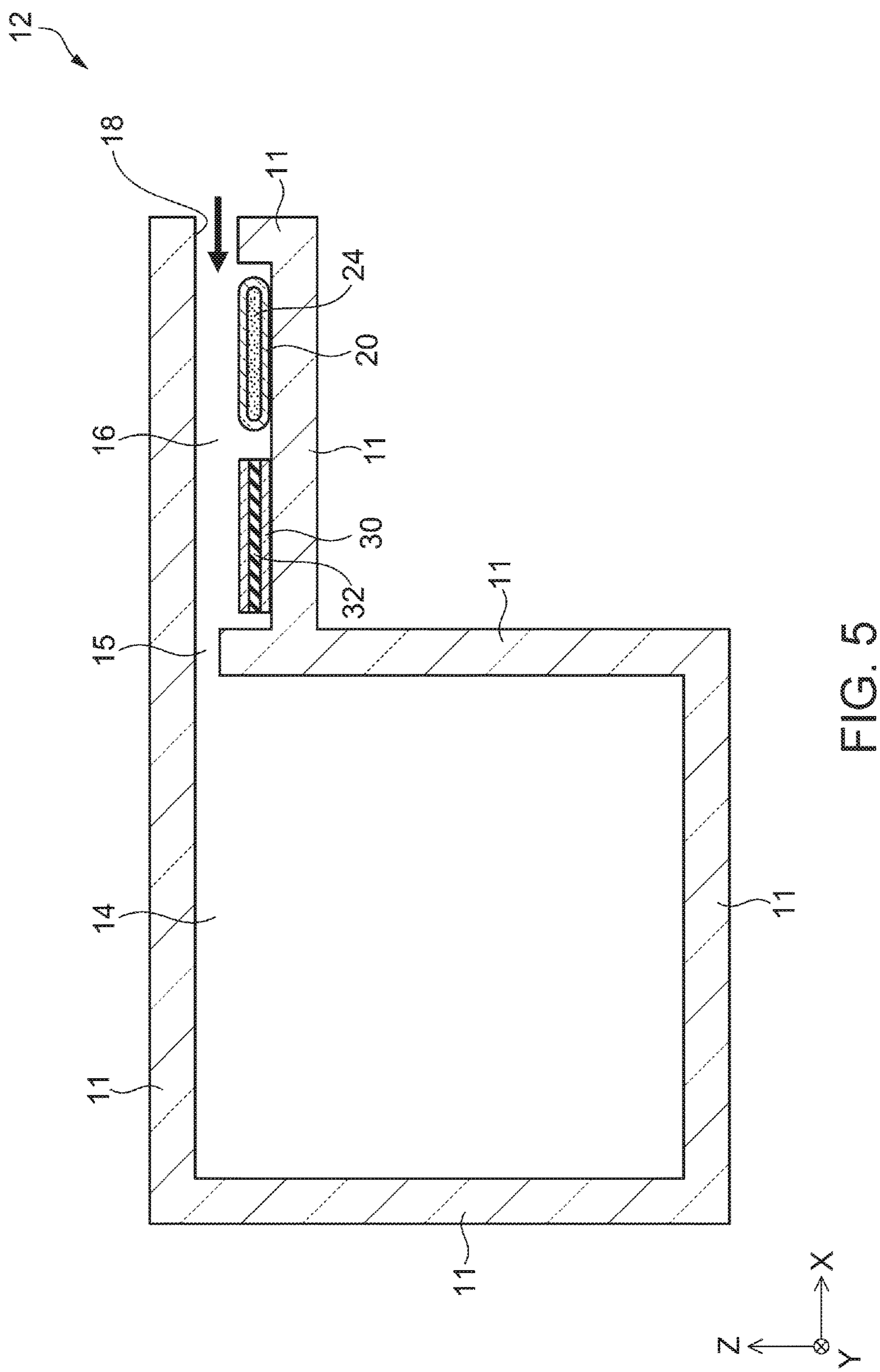
FIG. 5 is a diagram for explaining a manufacturing method for the gas cell according to the present embodiment.
Figure 6:
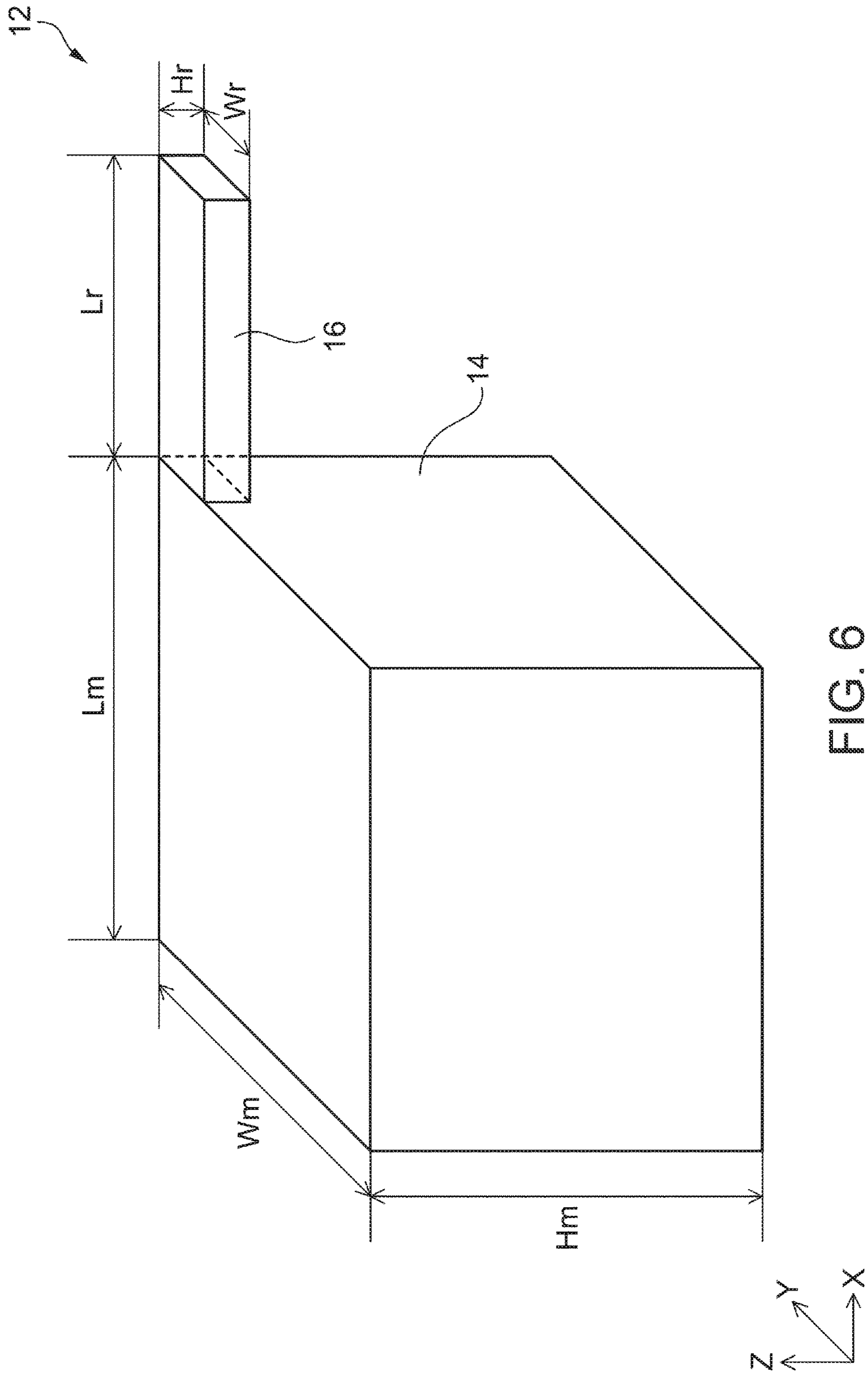
FIG. 6 is a diagram for explaining a manufacturing method for the gas cell according to the present embodiment.

Next, a description will be made of a manufacturing method for the gas cell according to the present embodiment with reference to FIGS. 5, 6, 7, 8, 9 and 10. FIGS. 5, 6, 7, 8, 9 and 10 are diagrams for explaining a manufacturing method for the gas cell according to the present embodiment. FIGS. 5, 7, 8, 9 and 10 are sectional views of the gas cell corresponding to FIG. 2. FIG. 6 is a perspective view of the gas cell.

First, the cell 12 is assembled. FIG. 5 illustrates the assembled cell 12. FIG. 5 illustrates a state in which the ampoule 20 and the holding member 30 including the coating material 32 are disposed in the reservoir 16 of the cell 12 in a disposing step which will be described later.

As illustrated in FIG. 5, the cell 12 is formed by combining glass plate members 11 made of, for example, quartz glass. Although not illustrated, a glass plate made of quartz glass is cut, and the glass plate members 11 corresponding to respective wall surfaces forming the cell 12 are prepared. The glass plate members 11 are assembled, the glass plate members 11 are bonded to each other via an adhesive or through welding, and thus the cell 12 having the main chamber 14 and the reservoir 16 as illustrated in FIG. 5 is obtained. In this stage, the opening 18 of the cell 12 is open.

FIG. 6 illustrates dimensions of the cell 12 in an Example of the present embodiment. In the Example of the present embodiment, a width (a length in the Y axis direction) Wm, a length (a length in the X axis direction) Lm, and a height (a length in the Z axis direction) Hm of the main chamber 14 are respectively 18 mm, 18 mm, and 16.5 mm, and a width Wr, a length Lr, and a height Hr of the reservoir 16 are all 4 mm.

The ampoule 20 and the holding member 30 including the coating material 32 are prepared in a separate step (not illustrated). The ampoule 20 is formed by filling the cavity 22*a* of the tubular glass tube 22 with the alkali metal solid 24 and welding and sealing both ends of the glass tube 22 under a low pressure environment (ideally, under vacuum) close to vacuum (refer to FIGS. 3A and 3B). An alkali metal such as cesium used as the alkali metal solid 24 cannot be handled in the atmosphere due to rich reactivity, and is thus stored in the cell 12 in a state of being enclosed in the ampoule 20 under a low pressure environment.

The holding member 30 is a tubular glass tube having the cavity 30*a* (refer to FIGS. 4A and 4B). Since the holding member 30 has a tubular shape, the cavity 30*a* can be easily filled with the coating material 32 which is heated to a temperature of a melting point or higher under a low pressure environment close to vacuum, by using the capillary phenomenon. Since the holding member 30 is light transmissive, it is possible to easily check whether or not the coating material 32 can fill the cavity 30*a* with the naked eyes when filling the cavity.

An amount of the coating material 32 filling the cavity 30*a* may be adjusted by setting the length Lt of the holding member 30 and the inner diameter ϕt of the cavity 30*a* (that is, a volume of the cavity 30*a*). In the holding member 30 related to an Example of the present embodiment, the length Lt (refer to FIG. 4A) is 10 mm, and the inner diameter ϕt (refer to FIG. 4B) is 0.1 mm, with respect to the dimensions of the cell 12 (the main chamber 14 and the reservoir 16) related to the above-described Example.

Pentacontane ($C_{50}H_{102}$) is used as the coating material 32 related to an Example of the present embodiment. The coating material 32 having the above-described composition is heated to a temperature of about 150° C. to 200° C. under a low pressure environment reduced to about $2\times10^{-6}$ Torr, and fills the cavity 30*a* of the holding member 30 by using the capillary phenomenon.

When the coating material 32 fills the holding member 30, the coating material 32 may fill the holding member 30 which is cut to have a desired length Lt in advance. In addition, the coating material 32 may fill a base material of the holding member 30 longer than a desired length Lt, and then the base material may be cut into the holding members 30 having the desired length Lt along with the coating material 32.

Here, saturated chain hydrocarbon such as paraffin is generally a soft solid (waxy) at the room temperature, and thus the coating material 32 is hardly handled alone. In a case where the coating material 32 is handled alone, for example, there may be a method in which the coating material 32 is disposed in the cell 12 in a small amount by using a needle or the like. However, in this method, there is concern that an amount of the coating material 32 disposed in the cell 12 may vary relative to a desired amount, or the number of steps for disposing the coating material 32 in the cell 12 may increase.

If an amount of the coating material 32 disposed in the cell 12 varies, a film of the coating material 32 formed on the inner wall of the cell 12 (the main chamber 14 and the reservoir 16) may not have a desired film thickness, and film thicknesses of the coating materials 32 may be different from each other between individuals of a plurality of cells 12. Thus, quality (sensitivity, measurement accuracy, or the like) of the manufactured gas cell 10 deteriorates, or differences between qualities of individuals of the gas cells 10 occur.

In the present embodiment, an amount of the coating material 32 filling a cavity can be easily adjusted to and matched with a desired amount by appropriately setting the length Lt and the inner diameter ϕt of the holding member 30. It is possible to reduce a variation in an amount of the coating material 32 disposed in each cell 12 by managing the length Lt of the holding member 30 (reducing a variation in the length Lt thereof). Thus, it is possible to form a film of the coating material 32 with a desired film thickness on the inner wall of the cell 12, and also to minimize a variation in a thickness of a formed film of the coating material 32 in each cell 12. Consequently, it is possible to efficiently manufacture the gas cell 10 by reducing deterioration in quality of the gas cell 10 or reducing differences between qualities of individuals of the gas cells 10.

Next, as illustrated in FIG. 5, the ampoule 20 and the holding member 30 including the coating material 32 are disposed in the reservoir 16 of the cell 12 (disposing step). First, the cell 12 is heated to about 400° C. under a low pressure environment reduced to about $5\times10^{-6}$ Torr or less, and thus the main chamber 14 and the reservoir 16 of the cell 12 are degassed. After the cell 12 is cooled to the room temperature, as indicated by an arrow in FIG. 5, the ampoule 20 and the holding member 30 are inserted into the reservoir 16 along the longitudinal direction (X axis direction) through the opening 18. Arrangement positions of the ampoule 20 and the holding member 30 in the reservoir 16 are not particularly limited.

In the present embodiment, in the disposing step, since the coating material 32 is handled in a state of filling the holding member 30, the coating material 32 can be easily disposed in the reservoir 16 compared with a case of handling the coating material 32 alone. Consequently, compared with a case of handling the coating material 32 alone, it is possible to prevent an increase in the number of steps due to handling of the coating material 32 in the disposing step.

Figure 7:
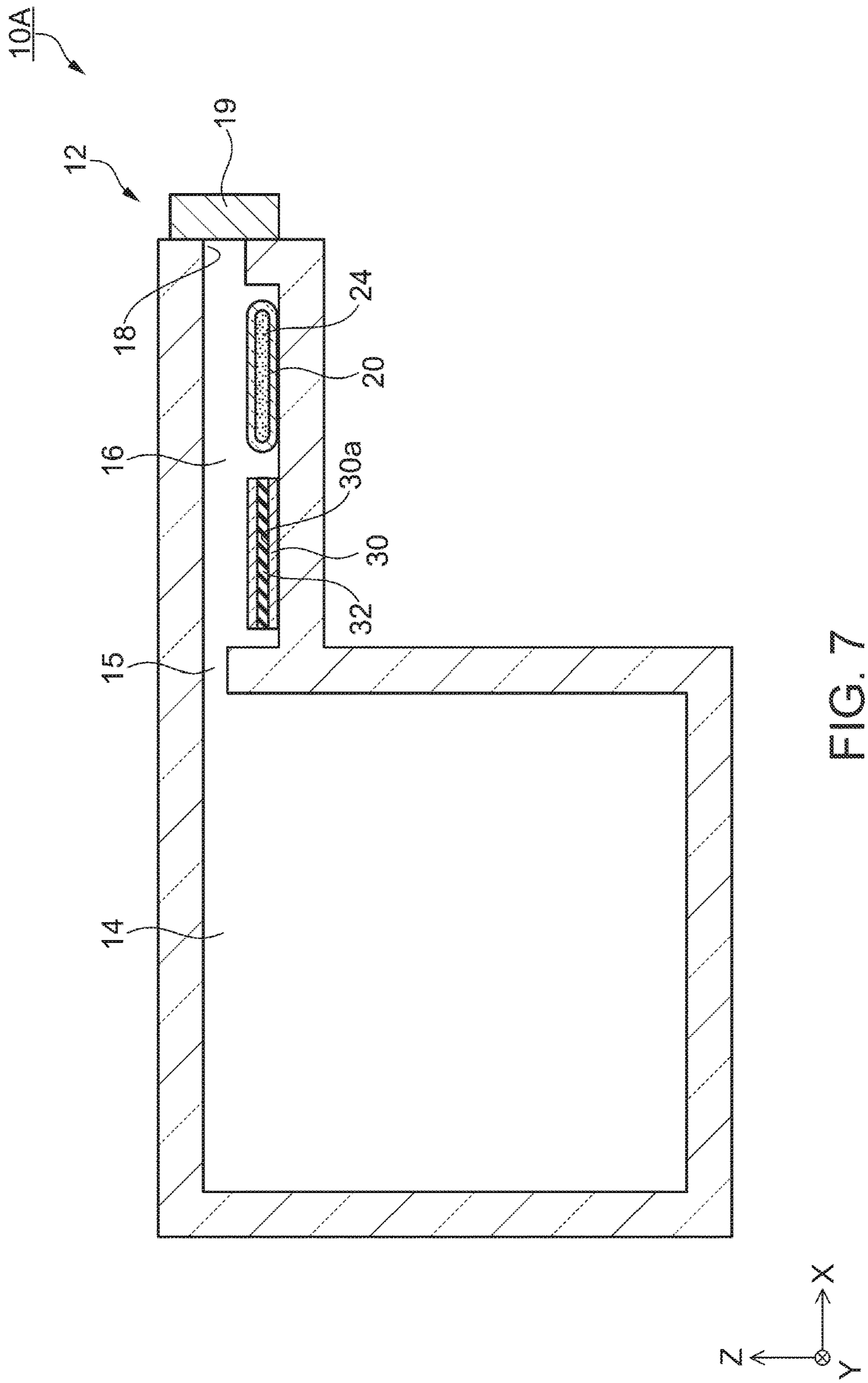
FIG. 7 is a diagram for explaining a manufacturing method for the gas cell according to the present embodiment.

Next, as illustrated in FIG. 7, the opening 18 is sealed with the sealing member 19 so that the cell 12 is sealed (sealing step). In the sealing step, the cell 12 is sufficiently degassed under a low pressure environment reduced to about $2\times10^{-6}$ Torr, and thus an amount of impurities is made extremely small in the main chamber 14 and the reservoir 16. A low melting point glass frit (not illustrated) is disposed around the opening 18 on at least one of the cell 12 and the sealing member 19, the cell 12 is sealed with the sealing member 19 through fixation to each other, and thus the cell 12 is sealed. The gas cell in this half-completed state is referred to as a gas cell 10A.

When the cell 12 is fixed to the sealing member 19, for example, the cell 12 may be disposed on the sealing member 19 so that the longitudinal direction thereof is along the vertical direction, and the opening 18 is located on a lower side in the vertical direction. In the above-described way, a load is applied to the cell 12 located on the upper side while heating the low melting point glass frit from the sealing member 19 side located on the lower side in the vertical direction, so that the cell 12 is brought into close contact with the sealing member 19, and thus efficient sealing can be performed.

Figure 8:
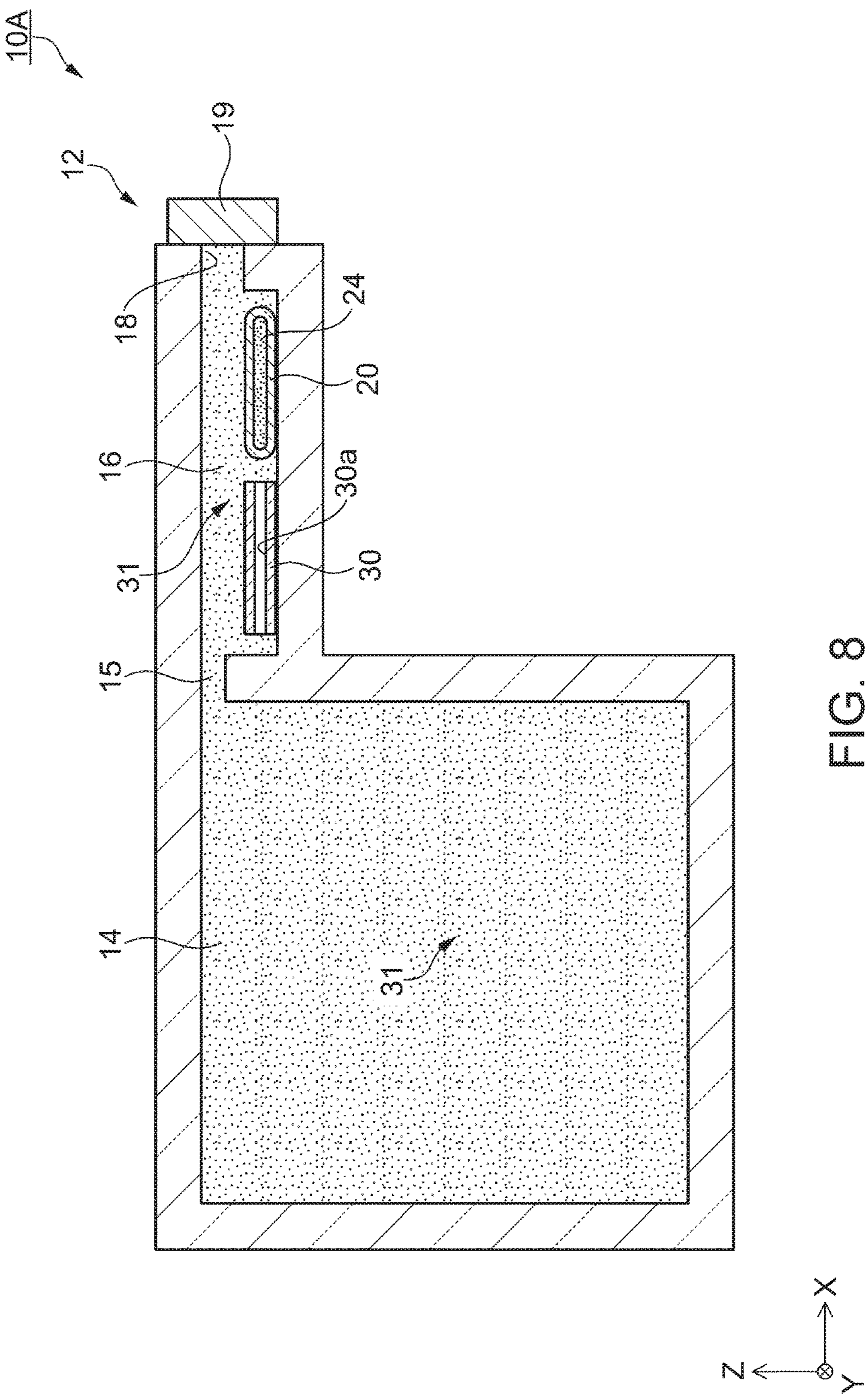
FIG. 8 is a diagram for explaining a manufacturing method for the gas cell according to the present embodiment.

Next, as illustrated in FIG. 8, the holding member 30 is heated so that a vapor 31 of the coating material 32 is generated in the cell 12 (heating step). In the heating step, the cell 12 (reservoir 16) is heated to, for example, about 230° C. in a state of the gas cell 10A illustrated in FIG. 7. As a result of heating the reservoir 16, the holding member 30 is heated, and thus the coating material 32 filling the cavity *30a* is heated and vaporized.

In the heating step, since the holding member 30 is a tubular member whose both ends are open, the coating material 32 filling the cavity *30a* can be easily vaporized from both ends of the holding member 30. Since the holding member 30 is made of the light transmissive material, it is possible to easily check whether or not the whole of the coating material 32 filling the cavity *30a* is vaporized.

Since the holding member 30 is made of the light transmissive material, the coating material 32 may be irradiated with laser light through the holding member 30 so as to be heated in the heating step. In the above-described way, the coating material 32 can be locally heated without heating the cell 12 (reservoir 16).

Since the holding member 30 is made of the heat-resistive material, it is possible to prevent degradation of the holding member 30 due to heat or generation of a gas from the holding member 30 in the heating step. Consequently, it is possible to prevent deterioration in quality (sensitivity, measurement accuracy, or the like) of the gas cell 10 caused by degradation of the holding member 30 or mixing of a gas from the holding member 30.

As illustrated in FIG. 8, the vapor 31 flowing into the reservoir 16 due to vaporization of the coating material 32 flows into the main chamber 14 from the reservoir 16 via the communication hole 15, and diffuses in the entire cell 12. The vapor 31 is attached to the inner walls of the main chamber 14 and the reservoir 16 so as to become a thin film of the coating material 32.

Figure 9:
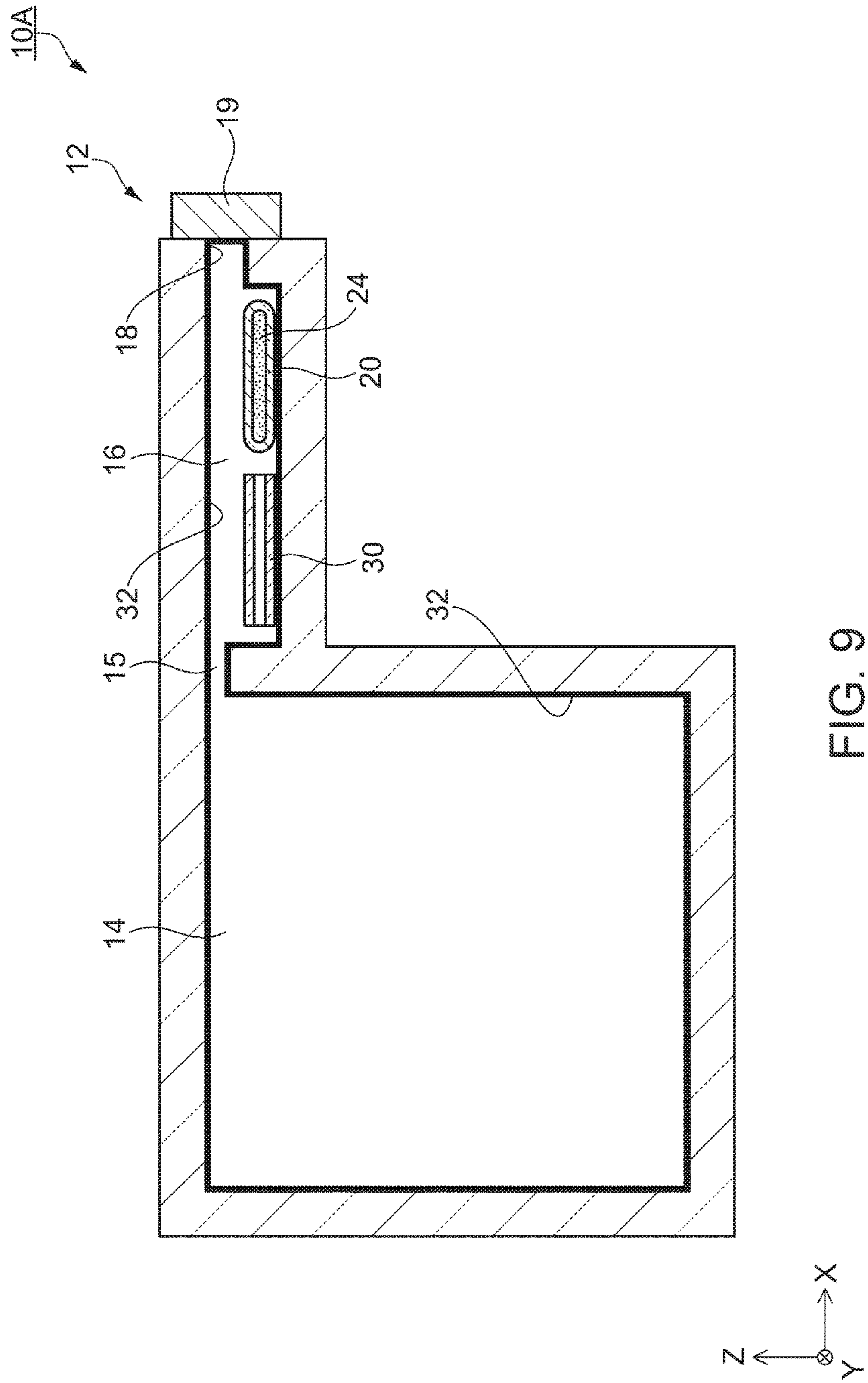
FIG. 9 is a diagram for explaining a manufacturing method for the gas cell according to the present embodiment.

Next, as illustrated in FIG. 9, the cell 12 is cooled so that a film of the coating material 32 is formed on the inner walls of the main chamber 14 and the reservoir 16 (film forming step). If the coating material 32 is vaporized in the heating step, the cell 12 is heated to, for example, about 200° C. for ten minutes, and is then gradually cooled, so that a thickness of the thin film of the coating material 32 formed on the inner walls of the main chamber 14 and the reservoir 16 is made uniform. Consequently, the film of the coating material 32 is formed to cover the inner walls of the main chamber 14 and the reservoir 16.

In the film forming step, in order to make the thickness of the thin film of the coating material 32 uniform, in addition to the above-described heating and gradual cooling, the cell 12 may be further heated to a temperature of about 80° C. to 200° C. for about one hour to ten hours, and may be then gradually cooled. In this case, the cell 12 may be continuously heated and gradually cooled, and may be repeatedly heated and gradually cooled for a plurality of number of times.

Figure 10:
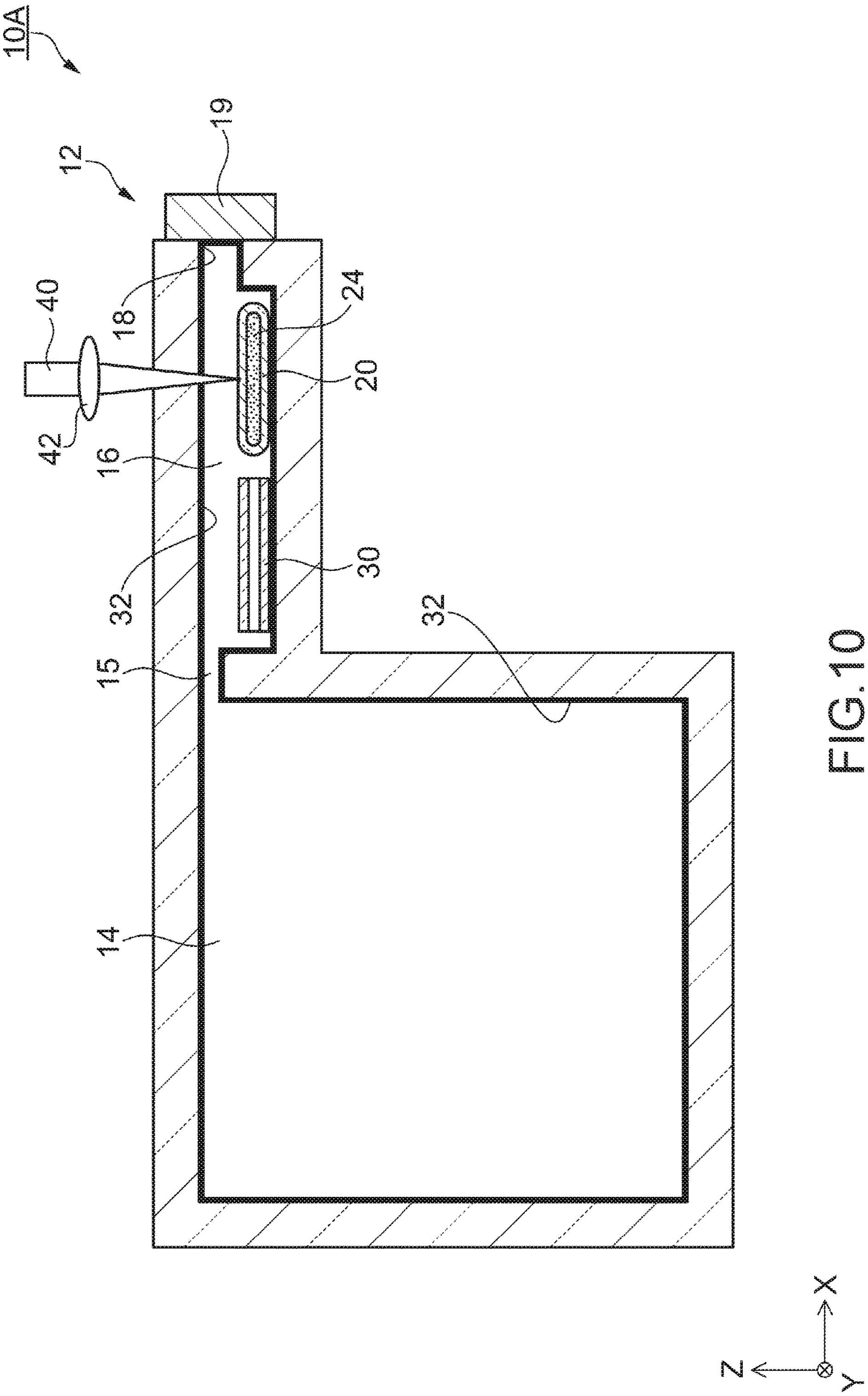
FIG. 10 is a diagram for explaining a manufacturing method for the gas cell according to the present embodiment.

Next, as illustrated in FIG. 10, the ampoule 20 is irradiated with laser light, and thus an alkali metal gas is generated (laser light irradiation step). Pulse laser light 40 is used as the laser light. In the laser light irradiation step, the pulse laser light 40 is collected by a condensing lens 42, and is applied to the glass tube 22 of the ampoule 20 disposed in the reservoir 16. The pulse laser light 40 is applied so that a focal point is formed on the upper surface of the ampoule 20 (glass tube 22) through the cell 12.

Consequently, as illustrated in FIG. 2, the penetration hole 21 is formed in the glass tube 22, and the alkali metal solid 24 (refer to FIG. 10) in the ampoule 20 is vaporized inside the reservoir 16 so as to become the alkali metal gas 13. The alkali metal gas 13 flowing into the reservoir 16 flows into the main chamber 14 of the cell 12 via the communication hole 15 and diffuses. As a result, as illustrated in FIG. 2, the cavity of the cell 12 is filled with the alkali metal gas 13.

The laser light is excellent in directivity or convergence, and thus the penetration hole 21 can be easily formed in the glass tube 22 by applying the pulse laser light 40 thereto. Energy of the pulse laser light 40 is set to, for example, 20 μJ/pulse to 200 μJ/pulse. A pulse width of the pulse laser light 40 is set to, for example, 10 nanoseconds to 50 nanoseconds, and is preferably about 30 nanoseconds. A repetition frequency of the pulse laser light 40 is set to, for example, about 50 kHz, and an irradiation time of the pulse laser light 40 is set to, for example, about 100 msec.

In order to reliably form the penetration hole 21 in the glass tube 22 of the ampoule 20, a position at which the ampoule 20 is irradiated with the pulse laser light 40 is preferably set so that a focal point of the pulse laser light 40 is located at the center of the ampoule 20 in the width direction (in the Y axis direction in FIG. 3B). If the focal point of the pulse laser light 40 is deviated relative to the center of the ampoule 20 in the width direction, there is a case where processing in the depth direction does not progress, and thus penetration of the glass tube 22 cannot be performed.

In the laser light irradiation step, it is necessary to form the penetration hole 21 in the glass tube 22 of the ampoule 20 without damaging the cell 12. Therefore, in a case where the cell 12 is made of quartz glass, and the glass tube 22 is made of borosilicate glass, for example, the pulse laser light 40 having a wavelength in an ultraviolet region is used. Light having a wavelength in an ultraviolet region is transmitted through the quartz glass, but is slightly absorbed by the borosilicate glass. Consequently, the penetration hole 21 can be formed by selectively processing the glass tube 22 of the ampoule 20 without damaging the cell 12 or the holding member 30.

In the laser light irradiation step, as long as the alkali metal solid 24 is vaporized and flows out of the ampoule 20, formation of the penetration hole 21 is only an example, and, for example, the ampoule 20 may be divided by causing cracks in the glass tube 22, and the glass tube 22 may be destroyed.

Through the above steps, the gas cell 10 according to the present embodiment is completed. A manufacturing method for the magnetic field measurement apparatus 100 according to the present embodiment includes the above-described manufacturing method for the gas cell 10. Steps of manufacturing the magnetic field measurement apparatus 100 according to the present embodiment may use well-known methods in steps other than the steps of manufacturing the gas cell 10, and thus description thereof will be omitted.

As described above, the following effects can be achieved according to the manufacturing method for the gas cell and the manufacturing method for the magnetic field measurement apparatus 100 of the present embodiment.

(1) In the disposing step, since the coating material 32 is handled in a state of being included in the holding member 30, an amount of the coating material 32 can be easily adjusted to a desired amount on the basis of the length Lt of the holding member 30, and the coating material 32 can also be disposed in the reservoir 16, compared with a case where only the coating material 32 is handled. It is possible to reduce a variation in an amount of the coating material 32 disposed in each cell 12 by managing the length Lt of the holding member 30 (reducing a variation in the length Lt thereof). Thus, in the film forming step, it is possible to stably forma film of the coating material 32 with a desired film thickness on the inner wall of the cell 12, and also to minimize a variation in a thickness of a formed film of the coating material 32 in each cell 12. Consequently, it is possible to stably and efficiently manufacture the gas cell 10 by reducing deterioration in quality (sensitivity, measurement accuracy, or the like) or reducing differences between qualities of individuals.

(2) Since the holding member 30 is made of the heat-resistive material, it is possible to prevent degradation of the holding member 30 due to heat or generation of a gas from the holding member 30 when the holding member 30 is heated in the heating step. Consequently, it is possible to prevent deterioration in quality (sensitivity, measurement accuracy, or the like) of the gas cell 10 caused by degradation of the holding member 30 or mixing of a gas from the holding member 30.

(3) The holding member 30 is made of a nonmagnetic material which is hardly magnetized even if the material is placed in a magnetic field. Thus, for example, in a case where the gas cell 10 is used for magnetic field measurement, it is possible to prevent magnetization of the holding member 30 from influencing the magnetic field measurement.

(4) The holding member 30 is a tubular member having the cavity 30*a* whose both ends are open. Thus, since the cavity 30*a* of the holding member 30 can be filled with the coating material 32 and hold the coating material 32, the coating material 32 can be easily handled. It is possible to easily adjust an amount of the coating material 32 filling the holding member 30 by setting the length Lt of the tubular holding member 30 as appropriate. When the vapor 31 of the coating material 32 is generated in the heating step, the coating material 32 filling the cavity 30*a* can be easily vaporized from both of the open ends by heating the holding member 30.

(5) The holding member 30 is made of a light transmissive material. Thus, it is possible to easily check whether or not the coating material 32 can fill the cavity 30*a* of the holding member 30 with the naked eyes when filling the cavity of the holding member. It is possible to easily check whether or not the whole of the coating material 32 is vaporized with the naked eyes when the vapor 31 of the coating material 32 is generated in the heating step. In the heating step, the coating material 32 can be irradiated with laser light through the holding member 30. Thus, the coating material 32 can be directly heated.

(6) The ampoule 20 is disposed in the reservoir 16 and is sealed along with the holding member 30 including the coating material 32, a film of the coating material 32 is formed on the inner wall of the cell 12, and then the alkali metal gas 13 is generated from the ampoule 20. Thus, the formed film of coating material 32 can prevent or reduce a change in a behavior when excited alkali metal atoms directly collide with the inner wall of the cell 12. It is possible to reduce the number of sealing steps to one, and thus to prevent impurities from entering the reservoir 16 from the outside after the film of the coating material 32 is formed, compared with a case where the cell 12 is temporarily sealed, the temporary sealing is removed after a film of the coating material 32 is formed on the inner wall, and the ampoule 20 is disposed in the reservoir 16 and is then sealed.

(7) It is possible to manufacture the magnetic field measurement apparatus 100 including the gas cell 10 with high quality and less variation, and thus to stably manufacture the high performance magnetic field measurement apparatus 100.

The above-described embodiment shows only one aspect of the invention, and any modifications and applications may occur within the scope of the invention. For example, the following modification examples may occur.

MODIFICATION EXAMPLE 1

Figure 11:
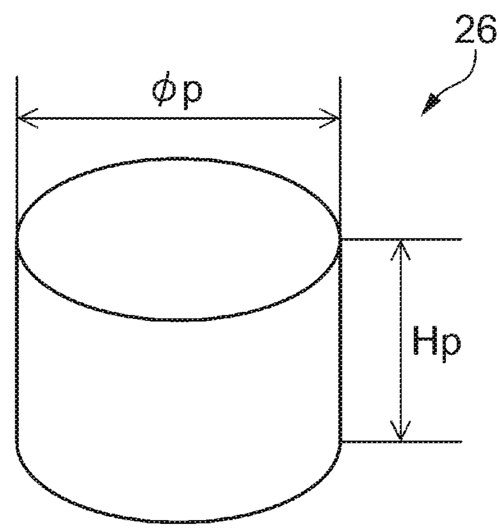
FIG. 11 is a perspective view illustrating a pill related to Modification Example 1.
Figure 12:
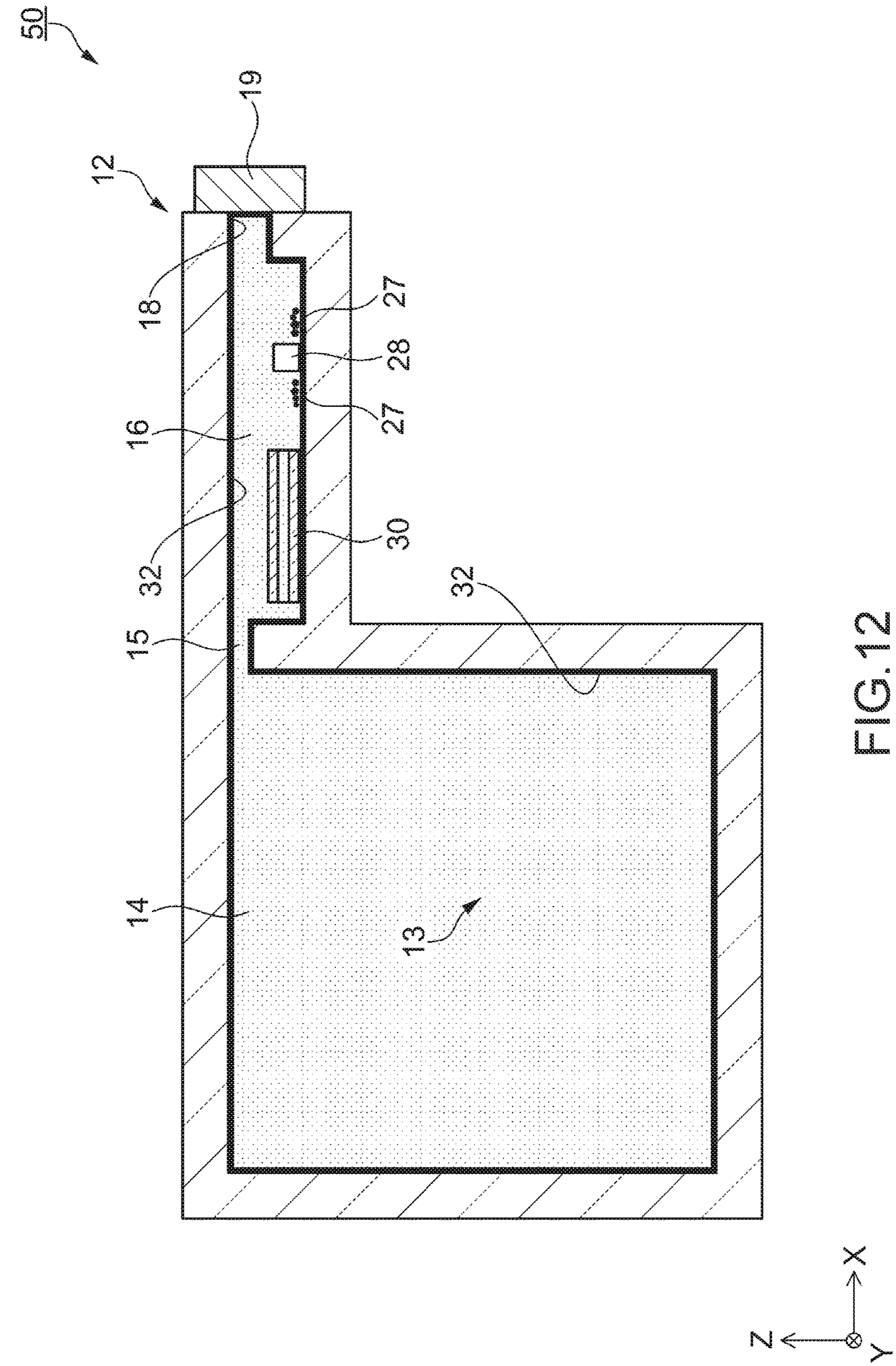
FIG. 12 is a sectional view along a longitudinal direction of a gas cell related to Modification Example 1.

A solid containing an alkali metal used to manufacture the gas cell according to the embodiment is not limited to the ampoule 20, and may have other forms. Modification Example 1 is different from the embodiment in that a solid containing an alkali metal has a form of a pill instead of an ampoule, but is substantially the same in terms of a configuration of a cell. With reference to FIGS. 11 and 12, a description will be made of configurations of a gas cell and a pill used for the gas cell related to Modification Example 1. Constituent elements common to the embodiment are given the same reference numerals, and description thereof will be omitted.

Configuration of Pill

First, a description will be made of a configuration of a pill as a solid containing an alkali metal related to Modification Example 1. FIG. 11 is a perspective view illustrating a pill related to Modification Example 1. As illustrated in FIG. 11, a pill 26 related to Modification Example 1 has, for example, a substantially cylindrical shape. A diameter ϕp of the cylindrical shape of the pill 26 is, for example, about 1 mm, and a height Hp of the cylindrical shape of the pill 26 is, for example, about 1 mm. An outer shape of the pill 26 is not limited to a substantially cylindrical shape, and may be other shapes such as a rectangular parallelepiped shape or a spherical shape.

The pill 26 contains an alkali metal compound and an adsorbent. If laser light is applied to the pill 26, the alkali metal compound is heated and activated, so that an alkali metal 27 is generated, and impurities or impure gases released at that time are adsorbed to an adsorbent 28 (refer to FIG. 12). In a case where cesium is used as the alkali metal 27, for example, cesium compounds such as cesium molybdate, and cesium chloride may be used as the alkali metal compound. For example, zirconium powder and aluminum may be used as the adsorbent 28.

Configuration of Gas Cell

FIG. 12 is a sectional view along a longitudinal direction of a gas cell related to Modification Example 1. As illustrated in FIG. 12, a gas cell 50 related to Modification Example 1 includes the same cell 12 and the sealing member 19 as those of the gas cell 10 according to the embodiment. In a state in which the gas cell 50 is completed, the alkali metal 27 (for example, cesium) is generated from the alkali metal compound of the pill 26 in the reservoir 16 (refer to FIG. 11), and the main chamber 14 and the reservoir 16 are filled with the alkali metal gas 13 as a result of the alkali metal 27 being vaporized. The adsorbent 28 to which impure gases are adsorbed, impurities, or the like may remain in the reservoir 16.

Manufacturing Method for Gas Cell

A manufacturing method for the gas cell related to Modification Example 1 has the same steps as those in the embodiment, but, since the ampoule 20 is replaced with the pill 26, a part of a processing method differs from the embodiment. Hereinafter, differences (not illustrated) from the embodiment will be described.

First, in a disposing step of disposing the holding member 30 including the coating material 32 in the cell 12, the pill 26 is stored in the reservoir 16 of the cell 12 instead of the ampoule 20.

In a laser light irradiation step, continuous oscillation laser light is applied to the pill 26 instead of the pulse laser light 40. As the continuous oscillation laser light, for example, laser diode (LD) laser light which continuously oscillates with wavelengths from a red region to an infrared region (about 680 nm to 1200 nm) may be used. A wavelength of the continuous oscillation laser light is preferably about 800 nm. An output from the continuous oscillation laser light is, for example, about 1 W to 10 W, and is preferably about 2 W to 5 W. The irradiation time of the continuous oscillation laser light is, for example, about ten seconds to five minutes, and is preferably about 30 seconds to 90 seconds.

The pill 26 is irradiated with the continuous oscillation laser light so as to be heated, and thus the alkali metal compound contained in the pill 26 is activated, thereby generating the alkali metal 27. The alkali metal 27 is vaporized to become the alkali metal gas 13 which then flows into the reservoir 16, and further flows into and diffuses in the main chamber 14 of the cell 12 via the communication hole 15. As a result, as illustrated in FIG. 12, the cavity of the cell 12 is filled with the alkali metal gas 13. Impurities or impure gases released from the alkali metal compound are adsorbed to the adsorbent 28.

Also in the manufacturing method for the gas cell and the manufacturing method for the magnetic field measurement apparatus 100 related to Modification Example 1, the coating material 32 for forming a film on the inner wall of the cell 12 is handled in a state of filling the holding member 30, and thus it is possible to achieve the same effects as those in the embodiment.

MODIFICATION EXAMPLE 2

Figure 13:
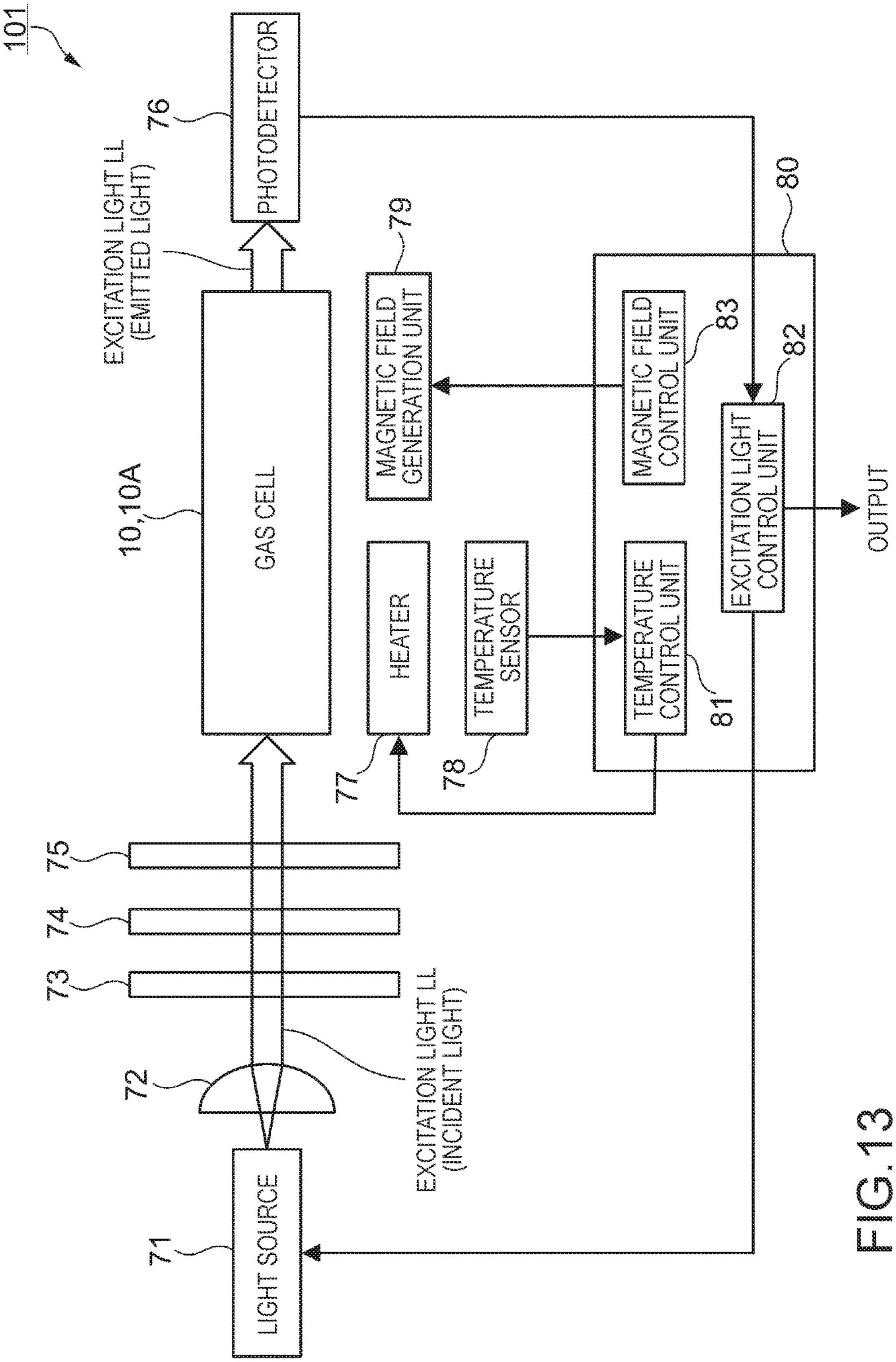
FIG. 13 is a schematic diagram illustrating a configuration of an atomic oscillator according to Modification Example 2.
Figure 14A:
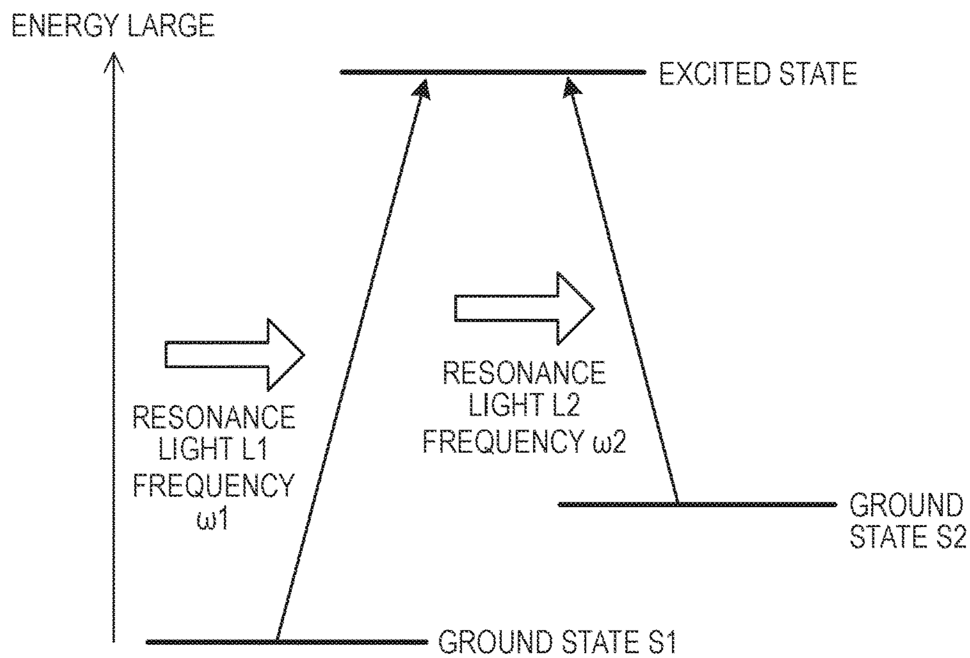
FIG. 14A is a diagram for explaining an operation of the atomic oscillator according to Modification Example 2.
Figure 14B:
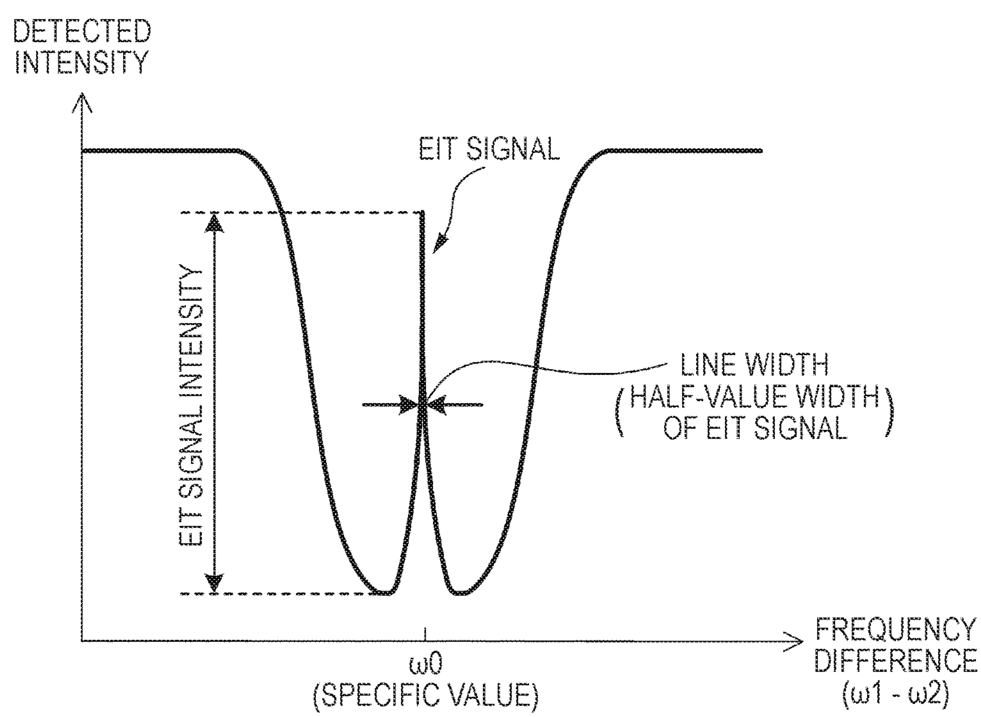
FIG. 14B is a diagram for explaining an operation of the atomic oscillator according to Modification Example 2.

An apparatus to which the gas cell according to the embodiment is applicable is not limited to the magnetic field measurement apparatus 100. The gas cells according to the embodiment and the modification example are applicable to an atomic oscillator such as an atomic clock. FIG. 13 is a schematic diagram illustrating a configuration of an atomic oscillator according to Modification Example 2. FIGS. 14A and 14B are diagrams for explaining an operation of the atomic oscillator according to Modification Example 2.

Atomic Oscillator

An atomic oscillator (quantum interference apparatus) 101 related to Modification Example 2 illustrated in FIG. 13 uses a quantum interference effect. As illustrated in FIG. 13, an atomic oscillator 101 includes the gas cell 10 (or the gas cell 50) according to the embodiment, a light source 71, optical components 72, 73, 74 and 75, a photodetector 76, a heater 77, a temperature sensor 78, a magnetic field generation unit 79, and a controller 80.

The light source 71 emits two kinds of light beams (resonance light L1 and resonance light L2 illustrated in FIG. 14A) having different frequencies which will be described later as excitation light LL which excites alkali metal atoms in the gas cell 10. The light source 71 is formed of, for example, a semiconductor laser device such as a vertical cavity surface emitting laser (VCSEL). The optical components 72, 73, 74 and 75 are provided on an optical path of the excitation light LL between the light source 71 and the gas cell 10, and the optical component 72 (lens), the optical component 73 (polarization plate), the optical component 74 (dimming filter), and the optical component 75 (λ/4 wavelength plate) are disposed in this order from the light source 71 side to the gas cell 10 side.

The photodetector 76 detects the intensity of the excitation light LL (the resonance light L1 and the resonance light L2) having been transmitted through the gas cell 10. The photodetector 76 is formed of, for example, a solar cell or a photodiode, and is connected to an excitation light control unit 82 of the controller 80 which will be described later. The heater 77 (heating unit) heats the gas cell 10 in order to maintain the alkali metal in the gas cell 10 in a gaseous state (as the alkali metal gas 13). The heater 77 (heating unit) is formed of, for example, a heating resistor.

The temperature sensor 78 detects the temperature of the heater 77 or the gas cell 10 in order to control a heat generation amount in the heater 77. The temperature sensor 78 is formed of various well-known temperature sensors such as a thermistor or a thermocouple. The magnetic field generation unit 79 generates a magnetic field for Zeeman splitting a plurality of degenerated energy levels of the alkali metal in the gas cell 10. A gap between different degenerated energy levels of the alkali metal is increased due to the Zeeman splitting, and thus a resolution can be improved. As a result, it is possible to increase the accuracy of an oscillation frequency of the atomic oscillator 101. The magnetic field generation unit 79 is formed of, for example, a Helmholtz coil or a solenoid coil.

The controller 80 includes the excitation light control unit 82 which controls a frequency of the excitation light LL (the resonance light L1 and the resonance light L2) emitted from the light source 71; a temperature control unit 81 which controls conduction of the heater 77 on the basis of a detection result from the temperature sensor 78; and a magnetic field control unit 83 which controls a magnetic field generated from the magnetic field generation unit 79 to be constant. The controller 80 is provided in, for example, an IC chip mounted on a board.

A principle of the atomic oscillator 101 will be described briefly. FIG. 14A is a diagram for explaining an energy state of the alkali metal in the gas cell 10 of the atomic oscillator 101, and FIG. 14B is a graph illustrating a relationship between a difference between frequencies of two light beams from the light source 71 of the atomic oscillator 101 and the intensity detected in the photodetector 76. As illustrated in FIG. 14A, the alkali metal (alkali metal gas 13) enclosed in the gas cell 10 has energy levels of a three-level system, and may take three states including two ground states (ground states S1 and S2) with different energy levels and an excited state. Here, the ground state S1 is an energy state lower than the ground state S2.

If the alkali metal gas 13 is irradiated with the two kinds of the resonance light L1 and the resonance light L2 having different frequencies, light absorptance (light transmittance) of the resonance light L1 and the resonance light L2 in the alkali metal gas 13 varies depending on a difference (ω1−ω2) between a frequency ω1 of the resonance light L1 and a frequency ω2 of the resonance light L2. When the difference (ω1−ω2) between the frequency ω1 of the resonance light L1 and the frequency ω2 of the resonance light L2 matches a frequency corresponding to an energy difference between the ground state S1 and the ground state S2, excitation from the ground states S1 and S2 to the excited state stops, respectively. At this time, neither of the resonance light L1 and the resonance light L2 are absorbed by the alkali metal gas 13, but are transmitted therethrough. This phenomenon is called a CPT phenomenon or an electromagnetically induced transparency (EIT) phenomenon.

The light source 71 emits the two kinds of light beams (the resonance light L1 and the resonance light L2) having different frequencies as described above, toward the gas cell 10. Here, for example, if the frequency ω1 of the resonance light L1 is fixed to a certain value, the frequency ω2 of the resonance light L2 is changed, when the difference (ω1−ω2) between the frequency ω1 of the resonance light L1 and the frequency ω2 of the resonance light L2 matches a frequency ω0 corresponding to an energy difference between the ground state S1 and the ground state S2, the intensity detected by the photodetector 76 rapidly increases as illustrated in FIG. 14B. This rapidly increasing signal is referred to as an EIT signal. The EIT signal has an inherent value which is defined by the kind of alkali metal. Therefore, it is possible to implement the highly accurate atomic oscillator 101 by using such an EIT signal as a reference.

According to the manufacturing method for the gas cell of the embodiment, it is possible to stably form a film of the coating material 32 with a desired film thickness in the cell 12, and thus to stably manufacture the gas cell 10 with high quality which can be appropriately used for the highly accurate atomic oscillator 101.

MODIFICATION EXAMPLE 3

A gas cell of the embodiment of the invention is not limited to the gas cells 10 and 50 in a state of being completed according to the manufacturing method for the gas cell of the embodiment, and may be the gas cell 10A in a half-completed state. A description will be made of a configuration of the gas cell 10A in a half-completed state related to Modification Example 3 with reference to FIG. 7.

Configuration of Gas Cell

As illustrated in FIG. 7, the gas cell 10A in a half-completed state related to Modification Example 3 is in a state in which the processes up to the sealing step are performed in the embodiment. In other words, the opening 18 is sealed with the sealing member 19, and thus the cell 12 of the gas cell 10A is sealed, in a state in which the inside thereof is decompressed, and an amount of impurities is extremely small. In the sealed cell 12 (reservoir 16), the alkali metal solid 24 for generating the alkali metal gas 13 is disposed in the ampoule 20 in an sealing state, and the coating material 32 for forming a film on the inner wall of the cell 12 is disposed in a state of filling the cavity 30*a* of the holding member 30.

Since the gas cell 10A is sealed in a state in which the inside thereof is decompressed, and an amount of impurities is extremely small, the gas cell 10A can be preserved or moved without damaging quality. The processes from the heating step to the laser light irradiation step in the embodiment are performed on the gas cell 10A, and thus the gas cell 10 can be completed. In the gas cell 10A, the pill 26 related to Modification Example 1 may be disposed in the reservoir 16 instead of the ampoule 20.

MODIFICATION EXAMPLE 4

Holding Member

A holding member of the embodiment of the invention is not limited to the tubular holding member 30 according to the embodiment, and may be other members as long as the members can hold the coating material 32 by using a capillary phenomenon, and are made of nonmagnetic materials. For example, as the holding member, a thread-like member obtained by twisting fibers together may be used, and a cloth-like member obtained by knitting threads may be used. It is also possible to achieve the same effects as those in the embodiment by using such members as the holding member.

The entire disclosure of Japanese Patent Application No. 2016-131380 filed Jul. 1, 2016 is expressly incorporated by reference herein.

What is claimed is:

1. A manufacturing method for a gas cell, the method comprising:

disposing a holding member including a coating material in a second chamber of a cell having a first chamber, the second chamber communicating with the first chamber, and an opening provided in the second chamber;

sealing the opening with a sealing member so as to seal the cell;

heating the holding member so as to generate a vapor of the coating material in the cell; and cooling the cell so as to form a film of the coating material on an inner wall of the cell, wherein the holding member is made of a heat-resistive material or a light transmissive material.

2. The manufacturing method for a gas cell according to claim 1, wherein the holding member is made of a heat-resistive material.

3. The manufacturing method for a gas cell according to claim 1, wherein the holding member is made of a nonmagnetic material.

4. The manufacturing method for a gas cell according to claim 1, wherein the holding member is a tubular member.

5. The manufacturing method for a gas cell according to claim 1, wherein the holding member is made of a light transmissive material.

6. The manufacturing method for a gas cell according to claim 1, wherein, in the disposing of the holding member, a solid containing an alkali metal is disposed in the second chamber along with the holding member, and the method further includes irradiating the solid with laser light so as to generate a gas of the alkali metal after the film of the coating material is formed.

7. A manufacturing method for an atomic oscillator, the method comprising manufacturing a gas cell by the manufacturing method for a gas cell according to claim 1.

8. A manufacturing method for an atomic oscillator, the method comprising manufacturing a gas cell by the manufacturing method for a gas cell according to claim 2.

9. A manufacturing method for an atomic oscillator, the method comprising manufacturing a gas cell by the manufacturing method for a gas cell according to claim 3.

10. A manufacturing method for an atomic oscillator, the method comprising manufacturing a gas cell by the manufacturing method for a gas cell according to claim 4.

11. A manufacturing method for an atomic oscillator, the method comprising manufacturing a gas cell by the manufacturing method for a gas cell according to claim 5.

12. A manufacturing method for an atomic oscillator, the method comprising manufacturing a gas cell by the manufacturing method for a gas cell according to claim 6.

13. A gas cell comprising:

a cell that has a first chamber, a second chamber communicating with the first chamber, and an opening provided in the second chamber;

a sealing member that seals the opening so as to seal the cell; and a holding member that includes a coating material disposed in the second chamber, wherein the holding member is made of a heat-resistive material or a light transmissive material.

14. The gas cell according to claim 13, wherein the holding member is made of a heat-resistive material.

15. The gas cell according to claim 13, wherein the holding member is made of a nonmagnetic material.

16. The gas cell according to claim 13, wherein the holding member is a tubular member.

17. The gas cell according to claim 13, wherein the holding member is made of a light transmissive material.

18. The gas cell according to claim 13, further comprising a solid that contains an alkali metal disposed in the second chamber.

* * * * *